(12) United States Patent
Seong et al.

(10) Patent No.: US 11,411,199 B2
(45) Date of Patent: Aug. 9, 2022

(54) DISPLAY PANEL INCLUDING MULTIPLE AREAS WITH A SEPARATOR DISPOSED THEREBETWEEN

(71) Applicant: SAMSUNG DISPLAY CO., LTD., Yongin-si (KR)

(72) Inventors: Ikjoong Seong, Yongin-si (KR); Kyunghan Kim, Yongin-si (KR); Dongwook Kang, Yongin-si (KR); Dongseong Koo, Yongin-si (KR); Kyungoh Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/722,060

(22) Filed: Dec. 20, 2019

(65) Prior Publication Data

US 2020/0287157 A1    Sep. 10, 2020

(30) Foreign Application Priority Data

Mar. 6, 2019    (KR) .......................... 10-2019-0025859

(51) Int. Cl.
*H01L 51/52* (2006.01)
*H01L 27/32* (2006.01)

(52) U.S. Cl.
CPC ........ *H01L 51/525* (2013.01); *H01L 27/3244* (2013.01)

(58) Field of Classification Search
CPC ............... H01L 51/525; H01L 27/3244; H01L 2227/323; H01L 27/3279; H01L 27/3258;
(Continued)

(56) References Cited

U.S. PATENT DOCUMENTS

| 8,928,018 B2 | 1/2015 | Ikeda et al. |
| 9,632,487 B2 | 4/2017 | Kim et al. |

(Continued)

FOREIGN PATENT DOCUMENTS

| CN | 108574054 | 9/2018 |
| CN | 109216575 | 1/2019 |

(Continued)

OTHER PUBLICATIONS

European Search Report dated Jul. 9, 2020 For European Patent Application No. 20155264.3.

*Primary Examiner* — Mohammad M Hoque
(74) *Attorney, Agent, or Firm* — F. Chau & Associates, LLC

(57) ABSTRACT

A display panel includes a substrate having a first area, a second area, and a third area disposed between the first area and the second area. A plurality of display elements are disposed in the second area. The plurality of display elements includes two display elements spaced apart from each other with the first area disposed therebetween. Each of the plurality of display elements includes a pixel electrode, a counter electrode, and an intermediate layer disposed between the pixel electrode and the counter electrode. A separator is located in the third area and includes at least one reverse-tapered inclined surface. An inorganic layer is disposed on the separator. At least one sub-layer included in the intermediate layer is discontinuous across the separator.

30 Claims, 31 Drawing Sheets

(58) Field of Classification Search
CPC ............. H01L 51/5253; H01L 51/5246; H01L 27/3246; H01L 27/3248; H01L 27/3272; H01L 27/3262; H01L 27/3265
USPC .......................................................... 257/40
See application file for complete search history.

(56) References Cited

U.S. PATENT DOCUMENTS

| | | | |
|---|---|---|---|
| 9,997,738 | B2 | 6/2018 | Choi et al. |
| 10,135,010 | B2 | 11/2018 | Kim et al. |
| 10,205,122 | B2 | 2/2019 | Choi et al. |
| 2009/0273589 | A1* | 11/2009 | Asano ................. H01L 27/3283 345/204 |
| 2017/0031323 | A1 | 2/2017 | Kim et al. |
| 2017/3148856 | | 5/2017 | Choi et al. |
| 2018/0233541 | A1* | 8/2018 | Zeng .................... H01L 27/323 |
| 2019/0326583 | A1 | 10/2019 | Abe |
| 2020/0067018 | A1* | 2/2020 | Kamiya ............. H01L 51/0097 |

FOREIGN PATENT DOCUMENTS

| | | |
|---|---|---|
| JP | 2012-182120 | 9/2012 |
| KR | 10-2007-0051628 | 5/2007 |
| KR | 10-2017-0015632 | 2/2017 |
| KR | 10-2017-0045459 | 4/2017 |
| KR | 10-2017-0059864 | 5/2017 |
| WO | WO 2018/030858 | 2/2019 |
| WO | WO 2018/200862 | 10/2019 |

\* cited by examiner

DISPLAY PANEL INCLUDING MULTIPLE AREAS WITH A SEPARATOR DISPOSED THEREBETWEEN

CROSS-REFERENCE TO RELATED APPLICATION

This application claims priority to and the benefit of Korean Patent Application No. 10-2019-0025859, filed on Mar. 6, 2019, in the Korean Intellectual Property Office, the present disclosure of which is herein incorporated by reference in its entirety.

TECHNICAL FIELD

The present disclosure relates to a display panel and, more particularly, to a display panel including multiple areas with a separator disposed therebetween.

DISCUSSION OF THE RELATED ART

Display apparatuses are electronic devices configured to display an image. Display apparatuses have recently been used in a wide variety of devices. In addition to being configured to display an image, modern display apparatuses tend to include additional sensory devices, such as touch sensors, light sensors, and other functional modules. As the thickness and weight of display apparatuses have been reduced, and in particular, the area of a bezel region surrounding a display region of the display apparatus has been reduced, many sensors that tended to be disposed within the bezel region have been moved to the display region of the display device.

SUMMARY

Exemplary embodiments of the present disclosure include a display panel having a first including a display area. Various components may be located in a display area. The display panel may be incorporated into a display apparatus.

According to one or more exemplary embodiments of the present disclosure, a display panel includes a substrate including a first area, a second area, and a third area disposed between the first area and the second area. A plurality of display elements is located in the second area. The plurality of display elements includes two display elements spaced apart from each other with the first area disposed therebetween. Each of the plurality of display elements including a pixel electrode, a counter electrode, and an intermediate layer disposed between the pixel electrode and the counter electrode. A separator is located in the third area and includes at least one reverse-tapered inclined surface. An inorganic layer is located on the separator. At least one sub-layer included in the intermediate layer is disconnected by the separator.

The at least one sub-layer may include an organic material.

An inorganic material may cover at least a part of a top surface of the separator and/or a side surface of the separator.

The at least one sub-layer may be located over the inorganic layer, and the separator may be located under the inorganic layer.

The separator may include a photosensitive material.

The at least one sub-layer may include a hole transport layer, a hole injection layer, an electron transport layer, and/or an electron injection layer.

The inorganic layer may include a hole corresponding to a top surface of the separator.

The display panel may further include a metal layer located in the third area. The separator may be located on the metal layer.

A width of the metal layer may be equal to or greater than a width of a top surface of the separator.

The inorganic layer may cover the metal layer and extend to an upper surface of an insulating layer under the metal layer.

The display panel may further include an organic layer located in the third area. The separator may be located on the organic layer.

The inorganic layer may cover the organic layer and extend to an upper surface of an insulating layer under the organic layer.

An inclination angle between the at least one reverse-tapered inclined surface and a top surface of the substrate may be equal to or less than 30°.

The display panel may further include at least one insulating layer located between the substrate and the separator. The at least one insulating layer may include a groove corresponding to the separator.

The display panel may include an opening corresponding to the first area.

According to one or more exemplary embodiments of the present disclosure, a display panel includes a substrate including a first area, a second area, and a third area disposed between the first area and the second area. A plurality of display elements is located in the second area and includes two display elements spaced apart from each other to define the first area. A separator is located in the third area and extends along an edge of the first area. At least one insulating layer is located between the substrate and the separator. The separator includes a plurality of inclined surfaces. At least one inclined surface of the plurality of inclined surfaces is reverse-tapered. A sub-layer includes an organic material provided in the plurality of display elements. The sub-layer is disconnected by the separator.

An inclination angle of the at least one reverse-tapered inclined surface with respect to a top surface of the substrate may be equal to or less than 30°.

Inclination angles of the plurality of reverse-tapered inclined surfaces may be different from one another.

The separator may include a photosensitive resin.

The at least one insulating layer may include an inorganic insulating layer.

The at least one insulating layer may include a groove. The separator may be located in the groove.

The display panel may further include a metal layer located between the at least one insulating layer and the separator. The separator may contact the metal layer.

A width of the metal layer may be equal to or greater than a width of a top surface of the separator.

The display panel may further include an organic layer located between the at least one insulating layer and the separator. The separator may contact the organic layer.

A width of a top surface of the organic layer may be equal to or greater than a width of a bottom surface of the separator.

The display panel may further include an inorganic layer located on the separator. The inorganic layer covers a side surface of the separator and extends to the at least one insulating layer.

The inorganic layer may directly contact the at least one insulating layer.

The inorganic layer may have a hole corresponding to a top surface of the separator.

The inorganic layer may include a metal or an inorganic insulating material.

The inorganic layer may extend to the second area.

BRIEF DESCRIPTION OF THE DRAWINGS

A more complete appreciation for the present disclosure and may of the attendant aspects thereof will become apparent and more readily appreciated from the following description of the embodiments, taken in conjunction with the accompanying drawings, in which.

DETAILED DESCRIPTION

Figure 1:
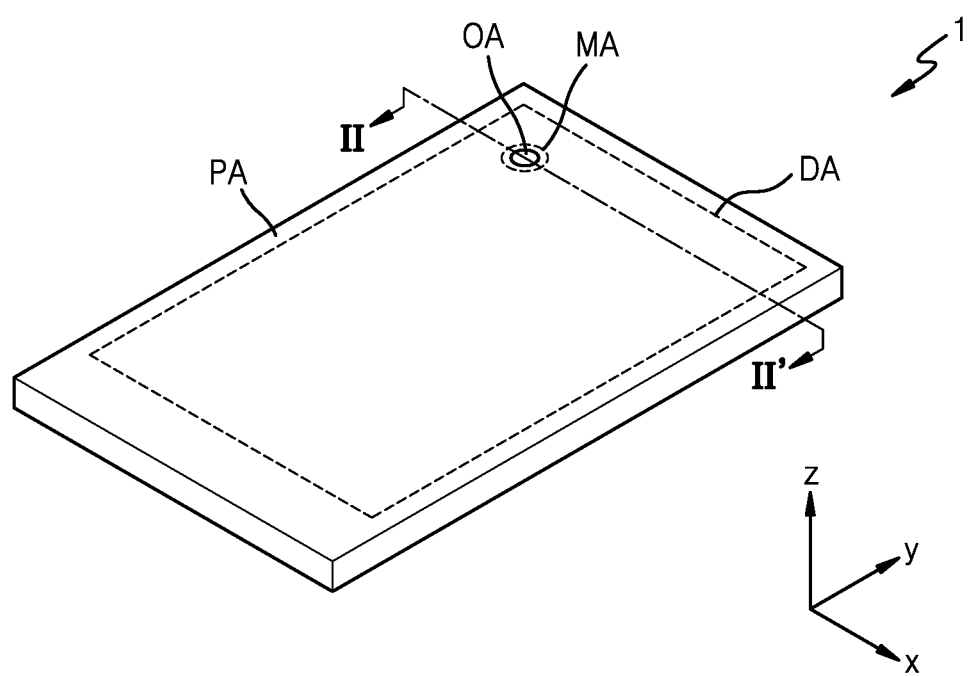
FIG. 1 is a perspective view illustrating a display apparatus according to an exemplary embodiment of the present disclosure.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Reference will now be made in detail to exemplary embodiments of the present disclosure. In the drawings, the same and similar elements may be denoted by the same reference numerals, and to the extent that a detailed description of an element is omitted, it may be assumed that the element is at least similar to a corresponding element that has been described elsewhere in the specification.

It will be understood that although the terms "first", "second", etc. may be used herein to describe various elements, these elements should not be limited by these terms. These elements are only used to distinguish one element from another.

It will be further understood that the terms "comprises" and/or "comprising" used herein specify the presence of stated features or components, but do not preclude the presence or addition of one or more other features or components. However, the phrase "consisting of" used herein may specify that no other components are present.

It will be understood that when a layer, region, or element is referred to as being "formed on", another layer, region, or element, it may be directly or indirectly formed on the other layer, region, or element. For example, intervening layers, regions, or elements may be present.

Sizes of elements may be exaggerated for convenience of explanation. However, the shapes, angles, and relative sizes, may be taken as showing details for a particular exemplary embodiment of the present disclosure.

It should be noted that the particular order in which steps are described herein as being performed represents one way in which the present invention may be embodied. However, in other embodiments, the order may be changed. For example, two consecutively described processes may be performed substantially at the same time or performed in an order opposite to the described order.

It will be understood that when a layer, region, or element is referred to as being "connected", the layer, the region, or the element may be directly connected or may be indirectly connected with intervening layers, regions, or elements therebetween. For example, when a layer, a region, or an element is electrically connected, the layer, the region, or the element may be directly electrically connected or may be indirectly electrically connected with intervening layers, regions, or elements therebetween.

FIG. 1 is a perspective view illustrating a display apparatus 1 according to an exemplary embodiment of the present disclosure.

Referring to FIG. 1, the display apparatus 1 includes a first area OA and a display area DA. The display area DA is a second area at least partially surrounding the first area OA. The display apparatus 1 may provide a predetermined image by using light emitted by a plurality of pixels arranged in the display area DA. In FIG. 1, one first area OA is located inside the display area DA, and the first area OA may be entirely surrounded by the display area DA. Alternatively, the first area OA be partially surrounded by the display area DA, for example, by occupying an area at an edge of the first area OA. The first area OA may be an area where a component is located as described below with reference to FIG. 2.

An intermediate area MA that is a third area may be located between the first area OA and the display area DA, and the display area DA may be at least partially surrounded by a peripheral area PA that is a fourth area. The intermediate area MA and the peripheral area PA may be non-display areas where pixels are not located. The intermediate area MA may be entirely surrounded by the display area DA, and the display area DA may be entirely surrounded by the peripheral area PA.

Although an organic light-emitting display apparatus will be described as the display apparatus 1, according to exemplary embodiments of the present disclosure, the display apparatus of the present disclosure is not limited thereto. For example, any of various display apparatuses such as an inorganic light-emitting display (or an inorganic electroluminescent (EL) display) or a quantum dot light-emitting display may be used.

Although one first area OA having a substantially circular shape is provided in FIG. 1, the present disclosure is not limited thereto. There may be two or more first areas OA, and a shape of each first area OA may be modified in various ways such as a circular shape, an elliptical shape, a polygonal shape, a star shape, or a diamond shape. Moreover, each of the two or more first areas OA may have a different shape. Although one first area OA is located in an upper-side of the display area DA in FIG. 1, the present disclosure is not limited thereto. The location of the first area OA may modified in various ways such as center of the display area DA, or in a lower-side of the display area DA.

Figure 2A:
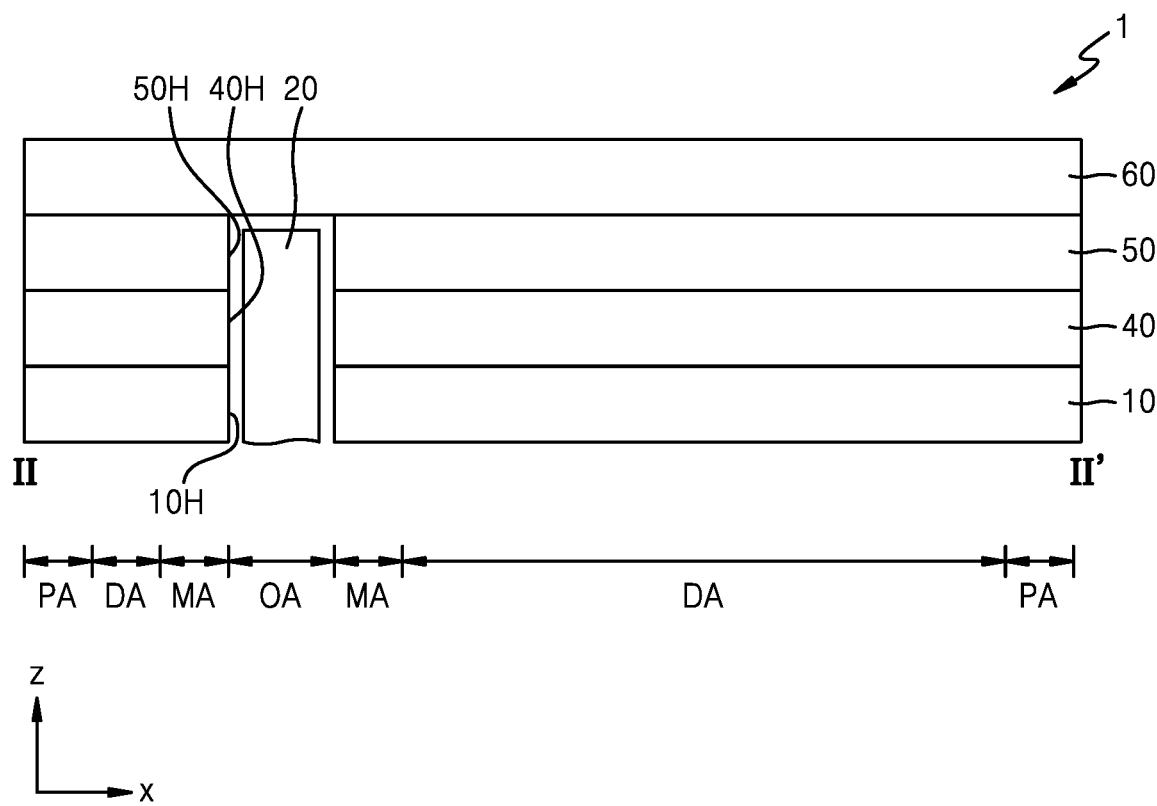
FIGS. 2A and 2B are cross-sectional views illustrating the display apparatus according to an exemplary embodiment of the present disclosure.
Figure 2B:
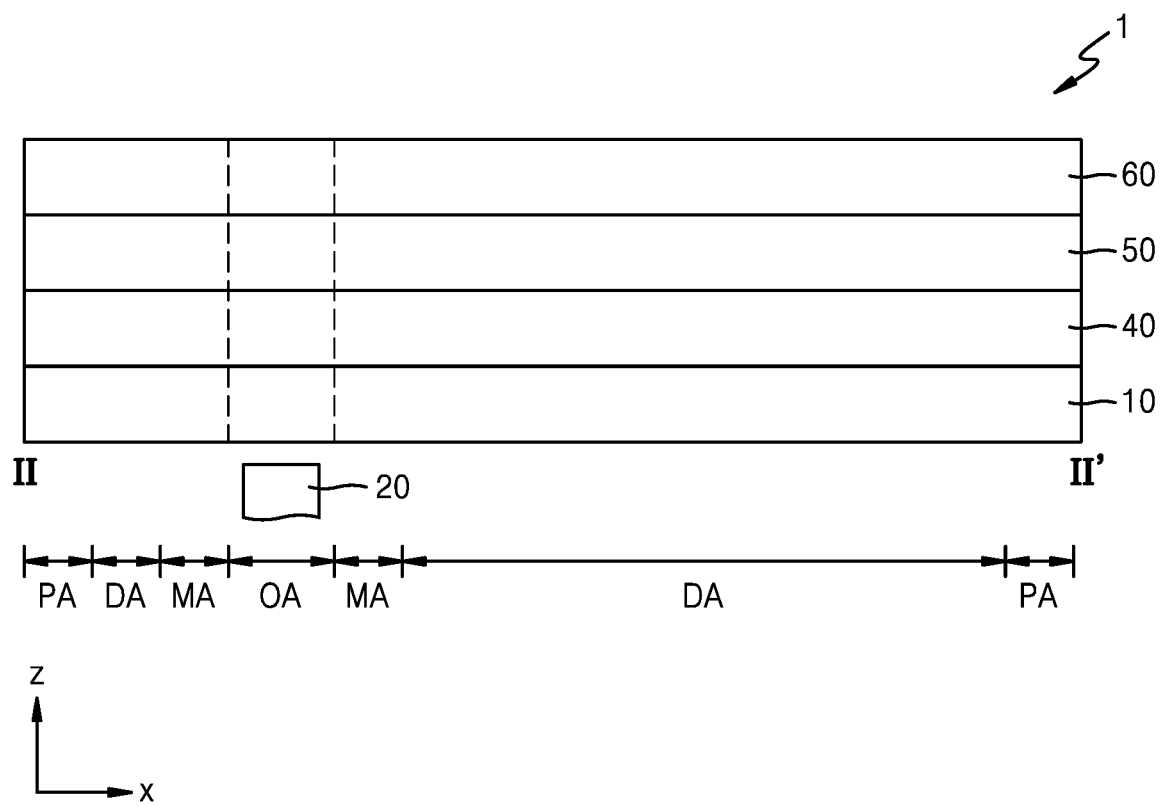

FIGS. 2A and 2B are cross-sectional views illustrating the display apparatus 1 according to an exemplary embodiment of the present disclosure, taken along line II-II' of FIG. 1.

Referring to FIG. 2A, the display apparatus 1 may include a display panel 10, an input sensing layer 40 located on the display panel 10, and an optical functional layer 50. The display panel 10, the input sensing layer 40, and the optical functional layer 50 may all be covered by a window 60. The display apparatus 1 may be a mobile phone, a notebook, a smart watch, or another electronic device.

The display panel 10 may display an image. The display panel 10 includes pixels arranged in the display area DA. The pixels may include a display element and a pixel circuit connected to the display element. The display element may include an organic light-emitting diode (OLED), an inorganic light-emitting diode, and/or a quantum dot light-emitting diode.

The input sensing layer 40 obtains coordinate information pertaining to an external input, for example, a touch event. The input sensing layer 40 may include a sensing electrode (or a touch electrode) and signal lines (e.g., trace lines) connected to the sensing electrode. The input sensing layer 40 may be located on the display panel 10. The input sensing layer 40 may be configured to detect an external input by using a mutual capacitance method and/or a self-capacitance method.

The input sensing layer 40 may be formed directly on the display panel 10, or may be separately formed and then may be coupled to the display panel 10 using an adhesive layer such as an optically clear adhesive (OCA). For example, the input sensing layer 40 may be continuously formed after a process of forming the display panel 10, and in this case, the input sensing layer 40 may be a part of the display panel 10 and an adhesive layer may be omitted. Although the input sensing layer 40 is located between the display panel 10 and the optical functional layer 50 in FIG. 2A, alternatively, the input sensing layer 40 may be located over the optical functional layer 50.

The optical functional layer 50 may include an anti-reflection layer. The anti-reflection layer may reduce a reflectance of light (e.g. external light) incident on the display panel 10 through the window 60. The anti-reflection layer may include a phase retarder and a polarizer. The phase retarder may be of a film type or a liquid crystal coating type and may include a $\lambda/2$ phase retarder and/or a $\lambda/4$ phase retarder. The polarizer may also be of a film type or liquid crystal coating type. The polarizer of the film type may include an elongated synthetic resin film. The polarizer of the liquid crystal coating type may include liquid crystals arranged with a predetermined initial orientation. The phase retarder and the polarizer may further include a protective film. The phase retarder and the polarizer or the protective film may be defined as a base layer of the anti-reflection layer.

According to an exemplary embodiment of the present disclosure, the anti-reflection layer may include a black matrix and color filters. The color filters may be arranged to define a color of light emitted by each of the pixels of the display panel 10. According to an exemplary embodiment of the present disclosure, the anti-reflection layer may include a destructive interference structure. The destructive interference structure may include a first reflective layer and a second reflective layer located on different layers. First reflected light and second reflected light respectively reflected by the first reflective layer and the second reflective layer may be destructively interfered with each other, thereby reducing a reflectance of external light thereupon.

The optical functional layer 50 may include a lens layer. The lens layer may increase light extraction efficiency of light emitted by the display panel 10 or may reduce color deviation. The lens layer may include a layer having a concave or convex lens shape, and/or may include a plurality of layers, each having different refractive indices. The optical functional layer 50 may include both the anti-reflection layer and the lens layer, or may include any one of the anti-reflection layer and the lens layer.

In an exemplary embodiment of the present disclosure, the anti-reflection layer may be continuously formed after a process of forming the display panel 10 and/or the input sensing layer 40. In this case, the anti-reflection layer may be a part of the display panel 10 and an adhesive layer may be omitted.

The display panel 10, the input sensing layer 40, and the optical functional layer 50 may have openings. In FIG. 2A, the display panel 10, the input sensing layer 40, and the optical functional layer 50 respectively have first through third openings 10H, 40H, and 50H, and the first through third openings 10H, 40H, and 50H may at least partially overlap one another. The first through third openings 10H, 40H, and 50H are formed to correspond to the first area OA. According to an exemplary embodiment of the present disclosure, at least one of the display panel 10, the input sensing layer 40, or the optical functional layer 50 might not have an opening. For example, one or two selected from among the display panel 10, the input sensing layer 40, and the optical functional layer 50 might not have an opening. Alternatively, the display panel 10, the input sensing layer 40, and the optical functional layer 50 might not have an opening as shown in FIG. 2B.

The first area OA may be a component area (e.g., a sensor area, a camera area, or a speaker area) where a component 20 for adding various functions is located, as described above. The component 20 may be located in the first through third openings 10H, 40H, and 50H as shown in FIG. 2A. Alternatively, the component 20 may be located under the display panel 10 as shown in FIG. 2B.

The component 20 may include an electronic element. For example, the component 20 may be an electronic element using light or sound. Examples of the electronic element that may be used may include a sensor for outputting and/or receiving light such as an infrared sensor, a camera for receiving light and capturing an image, a sensor for outputting and detecting light or sound to measure a distance or recognize a fingerprint, a small lamp for outputting light, and/or a speaker for outputting sound. When the component 20 is an electronic element using light, the component 20 may use light of various wavelength bands such as visible light, infrared light, and/or ultraviolet light. In some exemplary embodiments of the present disclosure, the first area OA may be a transmission area through which light and/or sound output from the component 20 to the outside or traveling from the outside toward the electronic element may be transmitted.

According to an exemplary embodiment of the present disclosure, when the display apparatus 1 is used as a smart watch or a vehicle instrument panel, the component 20 may be a member such as a clock hand or a needle indicating predetermined information (e.g., a vehicle speed). When the display apparatus 1 includes a clock hand or a vehicle instrument panel, the component 20 may pass through the window 60 and may be exposed to the outside, and the window 60 may have an opening corresponding to the first area OA.

The component 20 may include an element (or elements) related to a function of the display panel 10 as described above, or may include an element such as an accessory for enhancing the beauty of the display panel 10. For example, a layer including an OCA may be located between the window 60 and the optical functional layer 50.

FIGS. 3A through 3D are cross-sectional views illustrating the display panel 10 according to an exemplary embodiment of the present disclosure.

Figure 3A:
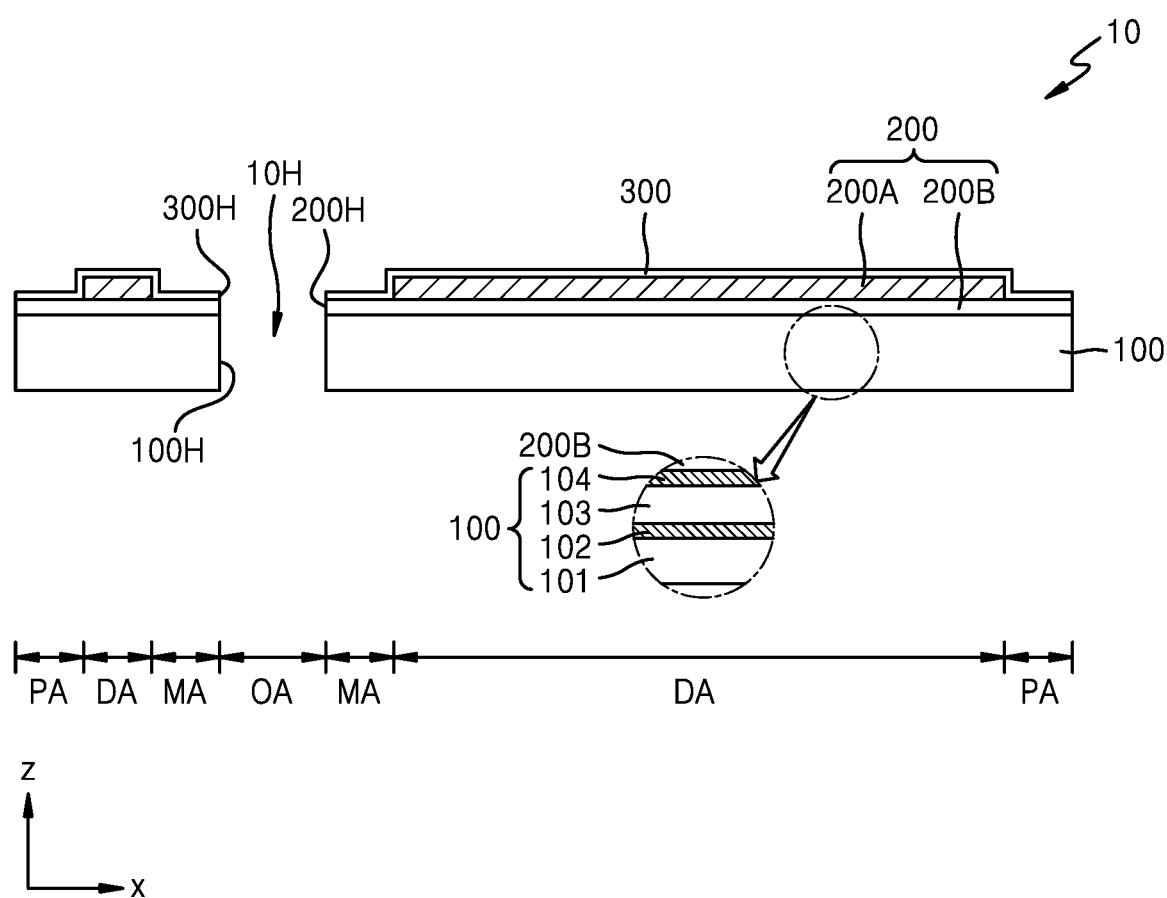
FIGS. 3A through 3D are cross-sectional views illustrating a display panel according to an exemplary embodiment of the present disclosure.

Referring to FIG. 3A, the display panel 10 includes a display layer 200 located on a substrate 100. The substrate 100 may include a glass material or a polymer resin. The substrate 100 may have a multi-layer structure. For example, the substrate 100 may include a first base layer 101, a first barrier layer 102, a second base layer 103, and a second barrier layer 104, for example, as shown in an enlarged view of FIG. 3A.

Each of the first base layer 101 and the second base layer 103 may include a polymer resin. For example, each of the first base layer 101 and the second base layer 103 may include polyethersulfone (PES), polyarylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose-triacetate (TAC), and/or cellulose acetate propionate (CAP). The polymer resin may be transparent.

Each of the first barrier layer 102 and the second barrier layer 104, that is a barrier layer for preventing penetration of external foreign materials, may have a single or multi-layer structure including an inorganic material such as silicon nitride or silicon oxide.

The display layer 200 includes a plurality of pixels. The display layer 200 may include a display element layer 200A including display elements respectively located for pixels, and a pixel circuit layer 200B including insulating layers and pixel circuits located for pixels. Each of the pixel circuits may include a thin-film transistor (TFT) and a storage capacitor, and each of the display elements may include an OLED.

The display elements of the display layer 200 may be covered by an encapsulation member such as a thin-film encapsulation layer 300, and the thin-film encapsulation layer 300 may include at least one inorganic encapsulation layer and at least one organic encapsulation layer. When the display panel 10 includes the substrate 100 having a multi-layer structure and the thin-film encapsulation layer 300, the flexibility of the display panel 10 may be increased.

The display panel 10 may have the first opening 10H passing through the display panel 10. The first opening 10H may be located in the first area OA, and in this case, the first area OA may be an opening area. The first opening 10H may be a through hole that passes through the display panel 10. In FIG. 3A, the substrate 100 and the thin-film encapsulation layer 300 respectively have through-holes 100H and 300H corresponding to the first opening 10H of the display panel 10. The display layer 200 may also have a through-hole 200H corresponding to the first area OA.

Figure 3B:
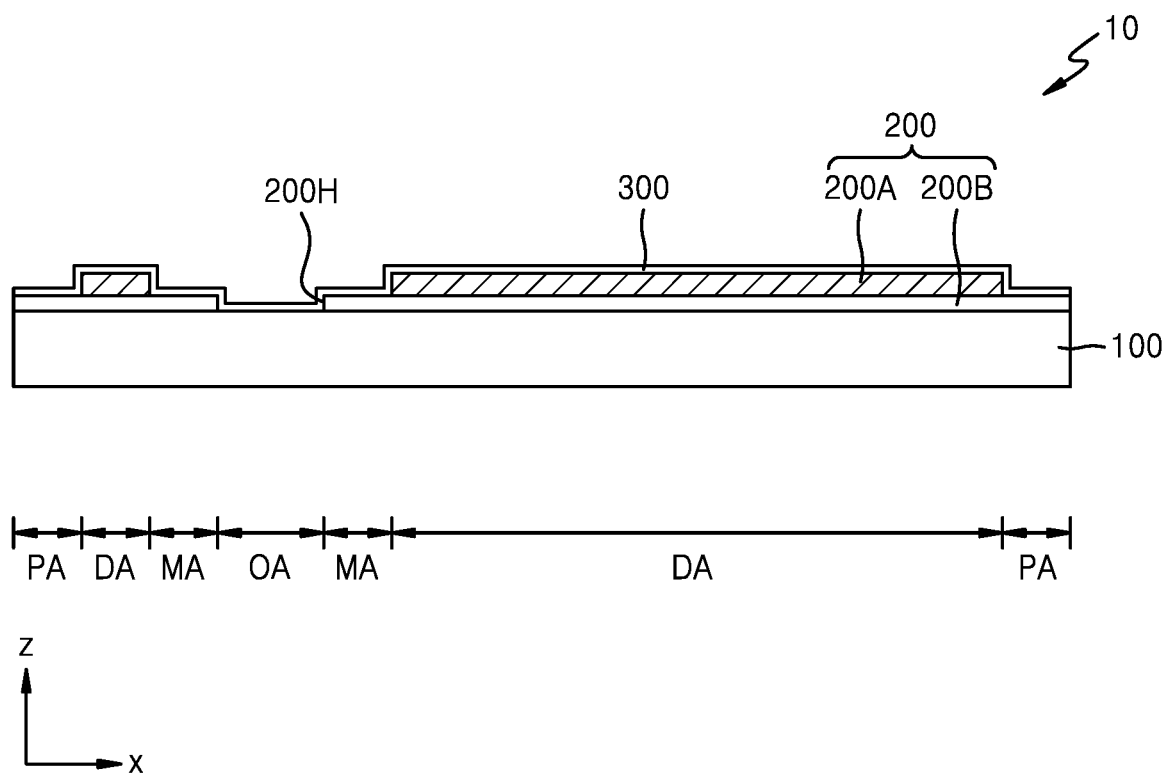

According to an exemplary embodiment of the present disclosure, as shown in FIG. 3B, the substrate 100 might not have a through-hole corresponding to the first area OA. The display layer 200 may have the through-hole 200H corresponding to the first area OA. The thin-film encapsulation layer 300 might not have a through-hole corresponding to the first area OA. According to an exemplary embodiment of the present disclosure, as shown in FIG. 3C, the display layer 200 might not have the through-hole 200H corresponding to the first area OA and the display element layer 200A might not be located in the first area OA.

Figure 3C:
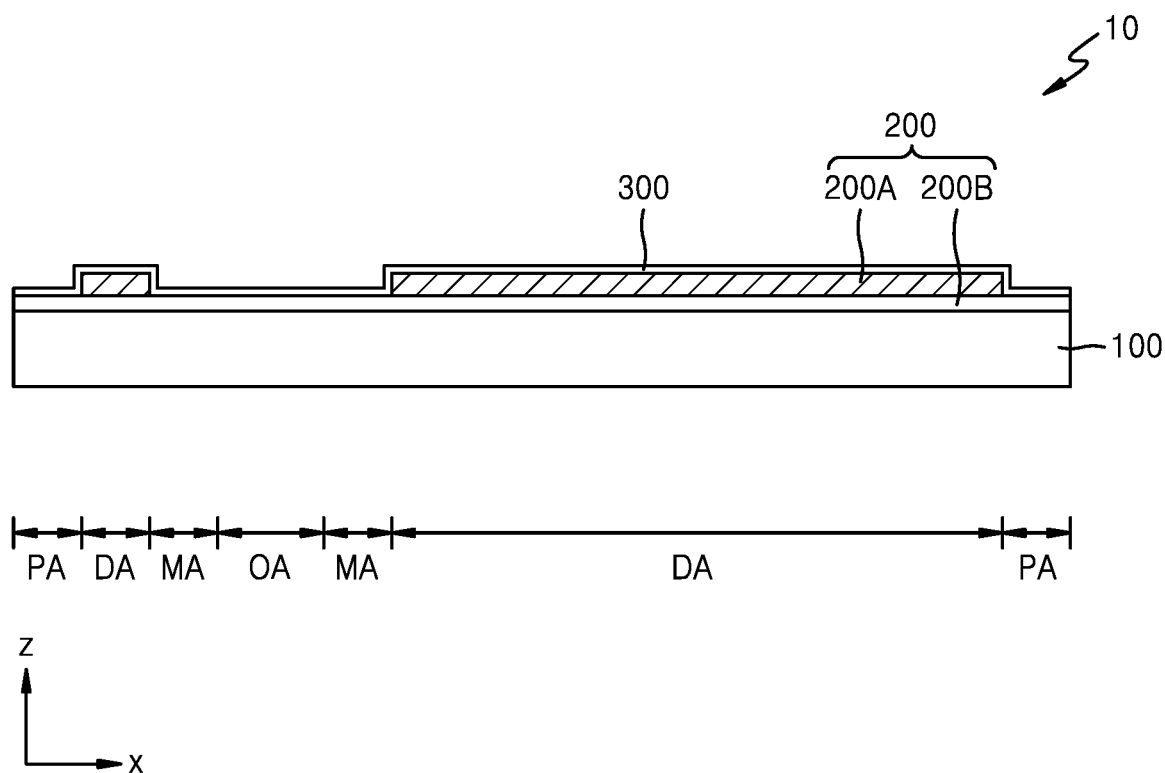
Figure 3D:
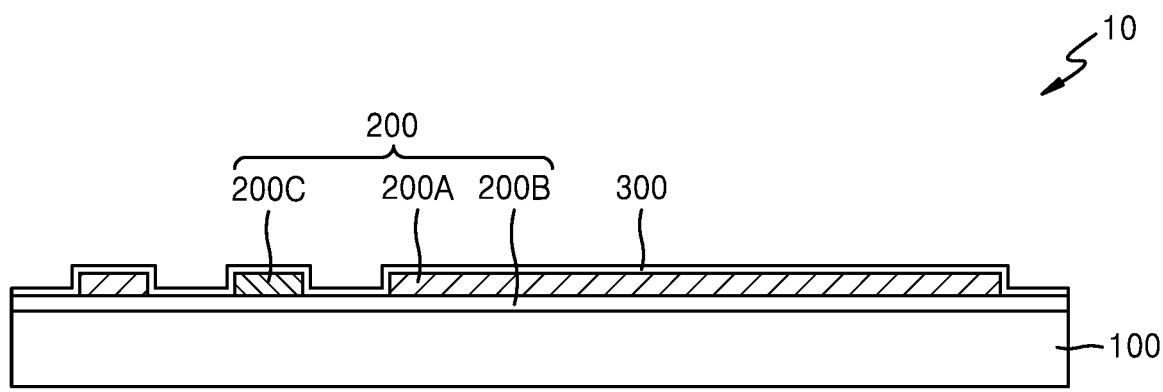
Figure 3D:
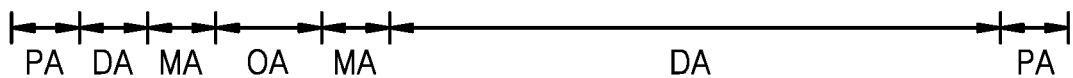
Figure 3D:
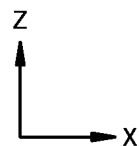

Although the display element layer 200A is not located in the first area OA in FIGS. 3A through 3C, the present disclosure is not limited thereto. According to an exemplary embodiment of the present disclosure, an auxiliary display element layer 200C may be located in the first area OA as shown in FIG. 3D. The auxiliary display element layer 200C may include a display element having a structure and/or an operation method different from those of a display element of the display element layer 200A.

In an exemplary embodiment of the present disclosure, each pixel of the display element layer 200A may include an active-matrix OLED, and each pixel of the auxiliary display element layer 200C may include a passive-matrix OLED. When the auxiliary display element layer 200C includes a display element of a passive-matrix OLED, elements constituting a pixel circuit might not exist under the passive-matrix OLED. For example, a portion of the pixel circuit layer 200B under the auxiliary display element layer 200C does not include a transistor and a storage capacitor.

According to an exemplary embodiment of the present disclosure, the auxiliary display element layer 200C may include a display element of the same type (e.g., an active-matrix OLED) as that of the display element layer 200A, and a structure of a pixel circuit located under the auxiliary display element layer 200C may be different from that under the display element layer 200A. For example, a pixel circuit (e.g., a pixel circuit including a shield film located between the substrate 100 and a transistor) located under the auxiliary display element layer 200C may have a structure different from that of a pixel circuit located under the display element layer 200A. Alternatively, display elements of the auxiliary display element layer 200C and display elements of the display element layer 200A may operate according to different control signals. A component (e.g., an infrared sensor) that does not require a relatively high transmittance may be located in the first area OA where the auxiliary display element layer 200C is located. In this case, the first area OA may be a component area or an auxiliary display area.

FIGS. 4A through 4D are cross-sectional views illustrating the display panel 10 according to an exemplary embodiment of the present disclosure. Unlike the display panel 10 including the thin-film encapsulation layer 300 in FIGS. 3A through 3D, the display panel 10 of FIGS. 4A through 4D may include an encapsulation substrate 300A and a sealant 340.

Figure 4A:
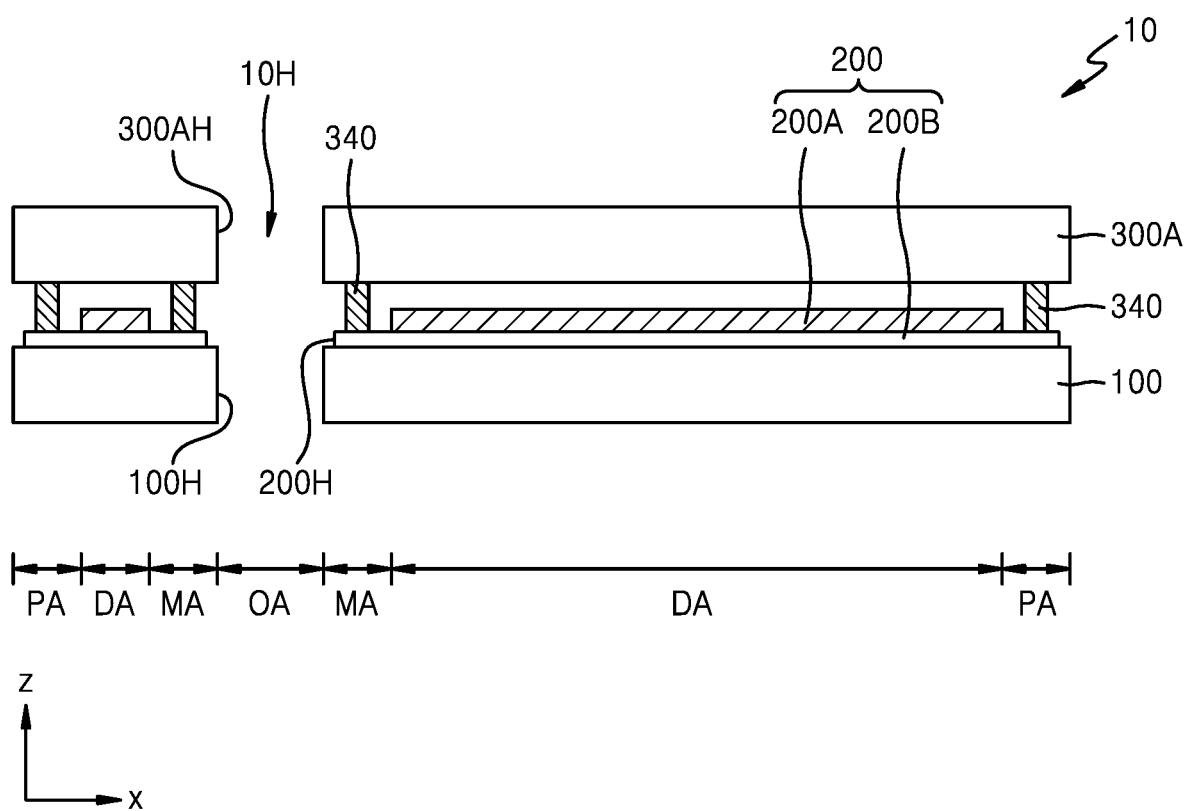
FIGS. 4A through 4D are cross-sectional views illustrating the display panel according to an exemplary embodiment of the present disclosure.
Figure 4B:
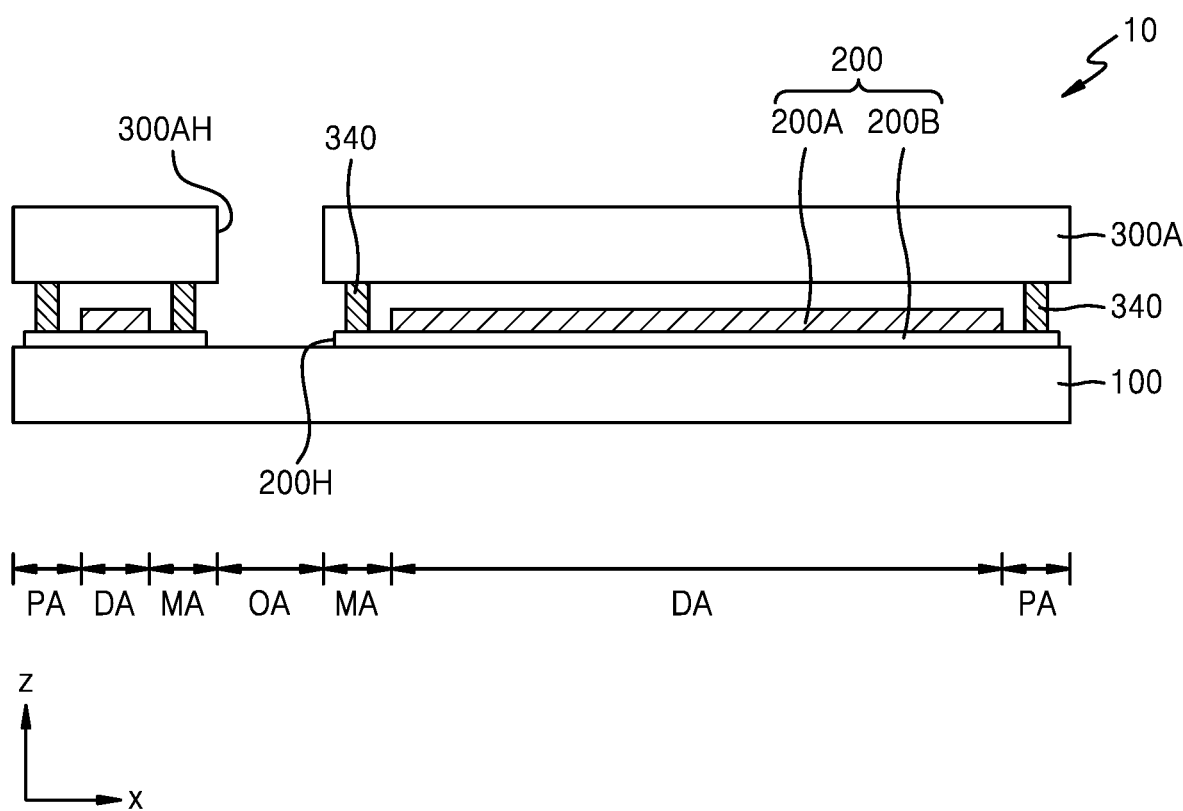
Figure 4C:
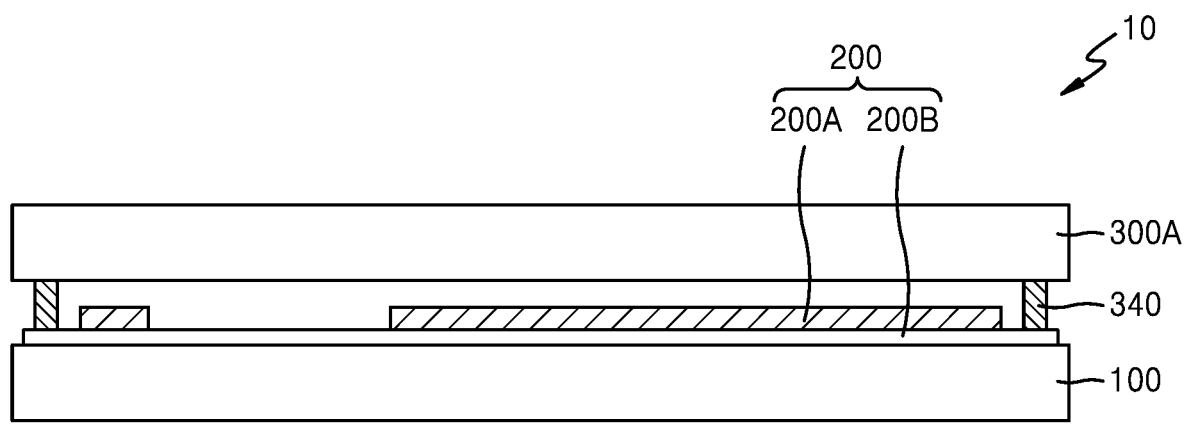
Figure 4D:
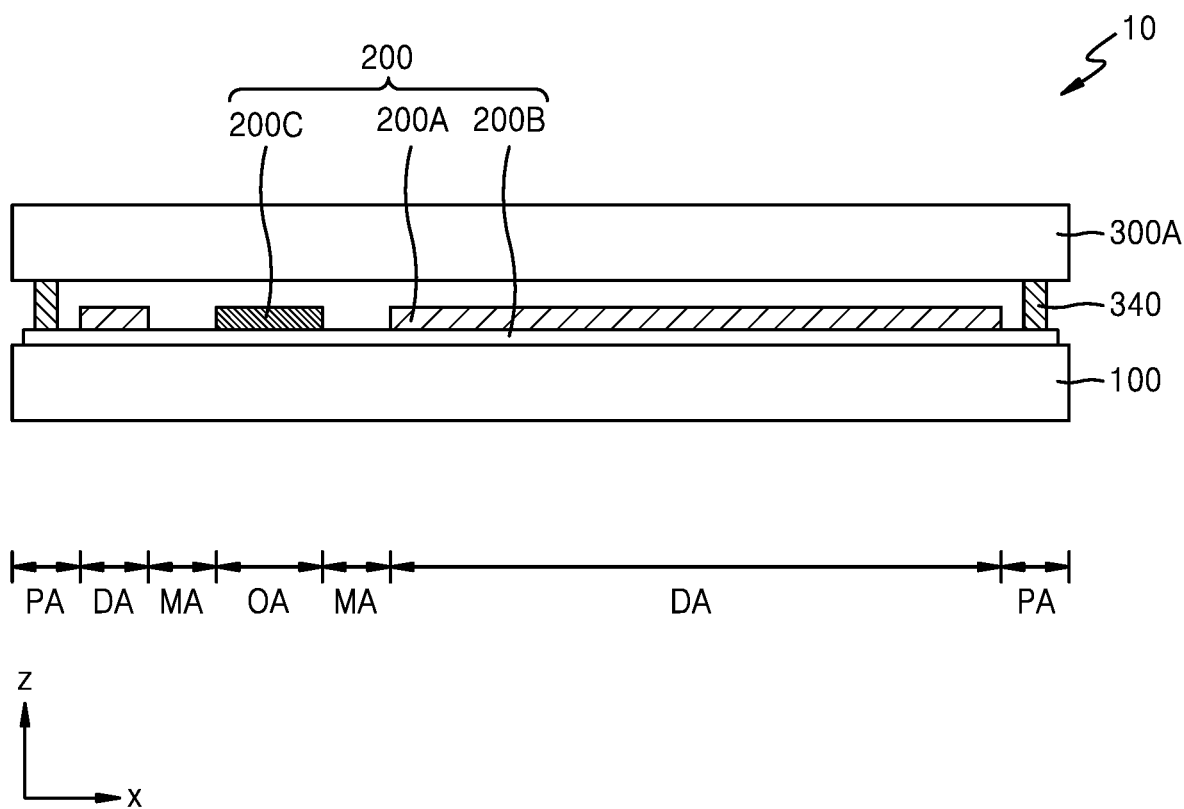

As shown in FIGS. 4A through 4C, one or more from among the substrate 100, the display layer 200, and the encapsulation substrate 300A may have the through-holes 100H, 200H, and 300AH corresponding to the first area OA. The display element layer 200A might not be located in the first area OA, or the auxiliary display element layer 200C may be located in the first area OA as shown in FIG. 4D. The auxiliary display element layer 200C may be at least similar to that described with reference to FIG. 3D.

Figure 5:
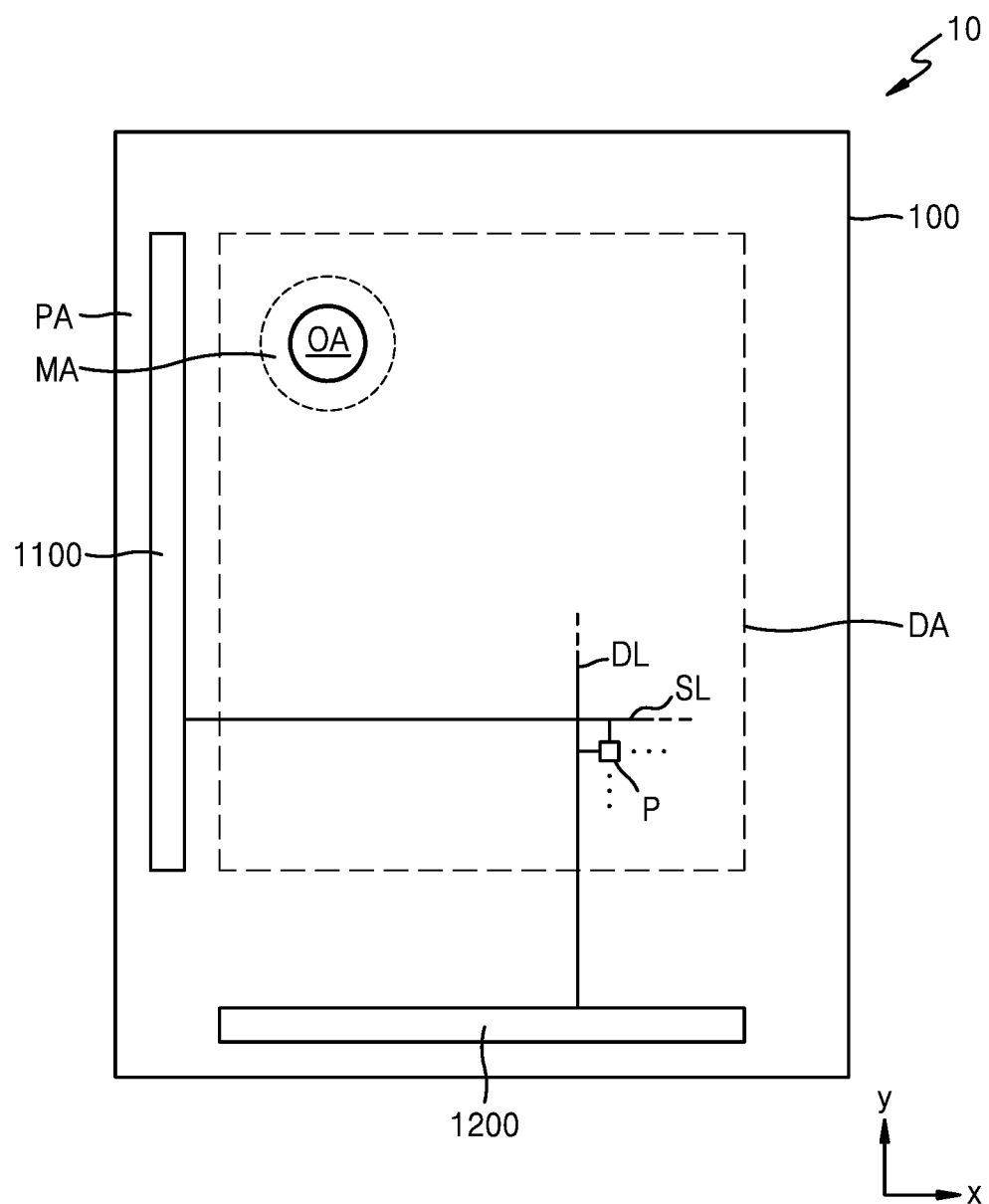
FIG. 5 is a plan view illustrating the display panel according to an exemplary embodiment of the present disclosure.
Figure 6:
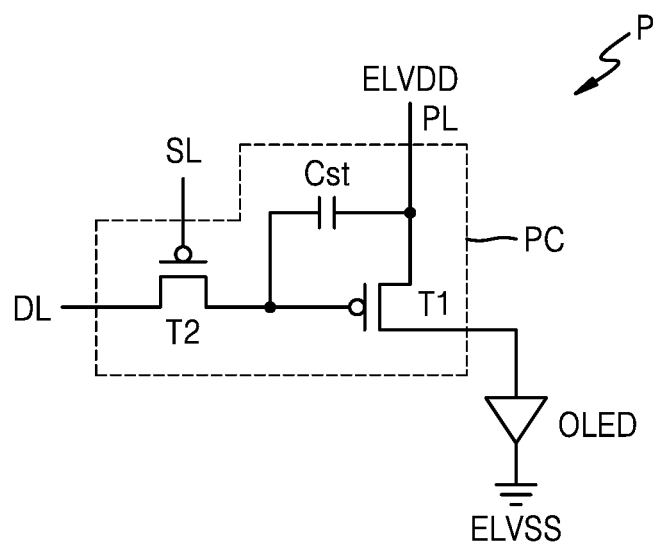
FIG. 6 is an equivalent circuit diagram illustrating a pixel of the display panel according to an exemplary embodiment of the present disclosure.

FIG. 5 is a plan view illustrating the display panel 10 according to an exemplary embodiment of the present disclosure. FIG. 6 is an equivalent circuit diagram illustrating a pixel of the display panel 10 according to an exemplary embodiment of the present disclosure.

Referring to FIG. 5, the display panel 10 may include the display area DA, the first area OA, the intermediate area MA, and the peripheral area PA. FIG. 5 illustrates the substrate 100 of the display panel 10. For example, the substrate 100 may be understood as including the display area DA, the first area OA, the intermediate area MA, and the peripheral area PA.

The display panel 10 includes a plurality of pixels P arranged in the display area DA. Each of the pixels P includes a pixel circuit PC and an OLED that is a display element connected to the pixel circuit PC as shown in FIG. 6. The pixel circuit PC may include a first TFT T1, a second TFT T2, and a storage capacitor Cst. Each pixel P may emit, for example, red, green, or blue light, or may emit red, green, blue, or white light, through the OLED.

The second TFT T2, that is a switching TFT, may be connected to a scan line SL and a data line DL and may transmit a data voltage input from the data line DL to the first TFT T1 according to a switching voltage input from the scan line SL. The storage capacitor Cst may be connected to the second TFT T2 and a driving voltage line PL, and may store a voltage corresponding to a difference between a voltage received from the second TFT T2 and a first power supply voltage ELVDD supplied to the driving voltage line PL.

The first TFT T1 that is a driving TFT may be connected to the driving voltage line PL and the storage capacitor Cst and may control driving current flowing from the driving voltage line PL to the OLED in response to the voltage stored in the storage capacitor Cst. The OLED may emit light having a predetermined luminance as determined by the driving current. A counter electrode (e.g., a cathode) of the OLED may receive a second power supply voltage ELVSS.

Although the pixel circuit PC is illustrated as including two TFTs and one storage capacitor in FIG. 6, the present disclosure is not limited thereto. The number of TFTs and the number of storage capacitors may be changed in various ways according to a design of the pixel circuit PC.

Referring back to FIG. 5, the intermediate area MA may at least partially surround the first area OA. The intermediate area MA is an area where a display element such as an OLED for emitting light is not located, and signal lines for applying signals to the pixels P arranged around the first area OA may pass through the intermediate area MA. A scan driver 1100 for applying a scan signal to each pixel P, a data driver 1200 for applying a data signal to each pixel P, and main power supply wirings for supplying a first power supply voltage and a second power supply voltage may be located in the peripheral area PA. Although the data driver 1200 is located adjacent to a side of the substrate 100 in FIG. 5, according to an exemplary embodiment of the present disclosure, the data driver 1200 may be located on a flexible printed circuit board (FPCB) electrically connected to a pad located at a side of the display panel 10.

Figure 7:
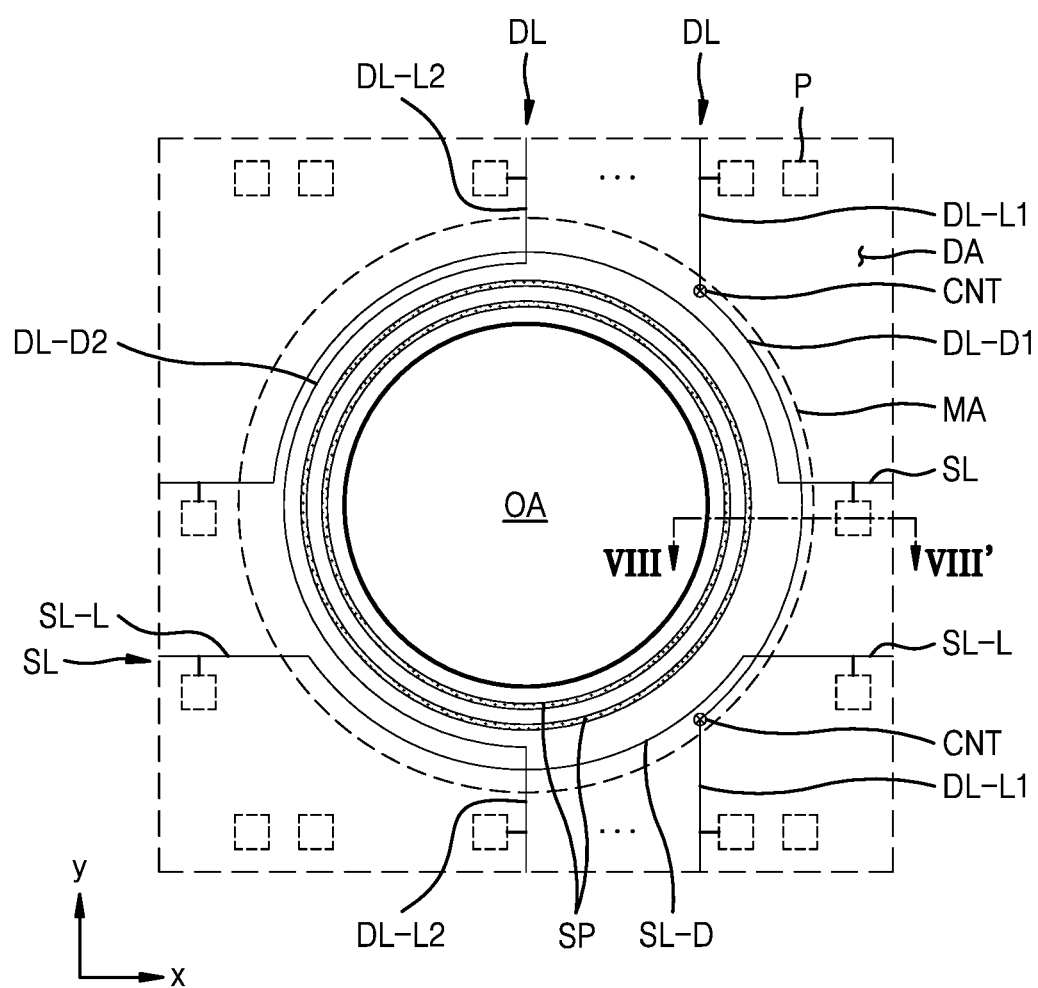
FIG. 7 is a plan view illustrating a part of the display panel according to an exemplary embodiment of the present disclosure.

FIG. 7 is a plan view illustrating a part of the display panel 10 according to an exemplary embodiment of the present disclosure.

Referring to FIG. 7, the pixels P are located in the display area DA about the first area OA. Some pixels P may be spaced apart from one another about the first area OA, and the first area OA may be defined between the pixels P. For example, in the plan view, the pixels P may be located above and below the first area OA and may be located at the left and the right of the first area OA.

Signal lines adjacent to the first area OA, from among signal lines that apply signals to the pixels P, may bypass (or detour) the first area OA. In the plan view of FIG. 7, at least one data line DL from among data lines passing through the display area DA may extend in a y-direction to apply a data signal to the pixels P located above and below the first area OA and may bypass along an edge of the first area OA in the intermediate area MA. In the plan view, at least one scan line SL, from among scan lines passing through the display area DA, may extend in an x-direction to apply a scan signal to the pixels P located at the left and the right of the first area OA, and may bypass along an edge of the first area OA in the intermediate area MA.

A bypassing portion SL-D of the scan line SL and an extending portion SL-L of the scan line SL crossing the display area DA may be located on the same layer and may be integrally formed. A bypassing portion DL-D1 of at least one data line DL and an extending portion DL-L1 of the at least one data line DL crossing the display area DA may be formed on different layers, and the bypassing portion DL-D1 and the extending portion DL-L1 of the at least one data line DL may be connected to each other through a contact hole CNT. A bypassing portion DL-D2 of at least one data line DL from among the data lines DL and an extending portion DL-L2 of the data line DL may be located on the same layer and may be integrally formed.

One or more separators SP may be located in the intermediate area MA. For example one or more separators SP may be located between the first area OA and a portion of the intermediate area MA where the scan lines SL and the data lines DL bypass. In the plan view, each of the separators SP may have a loop shape at least partially surrounding the first area OA, and the separators SP may be spaced apart from one another.

Figure 8:
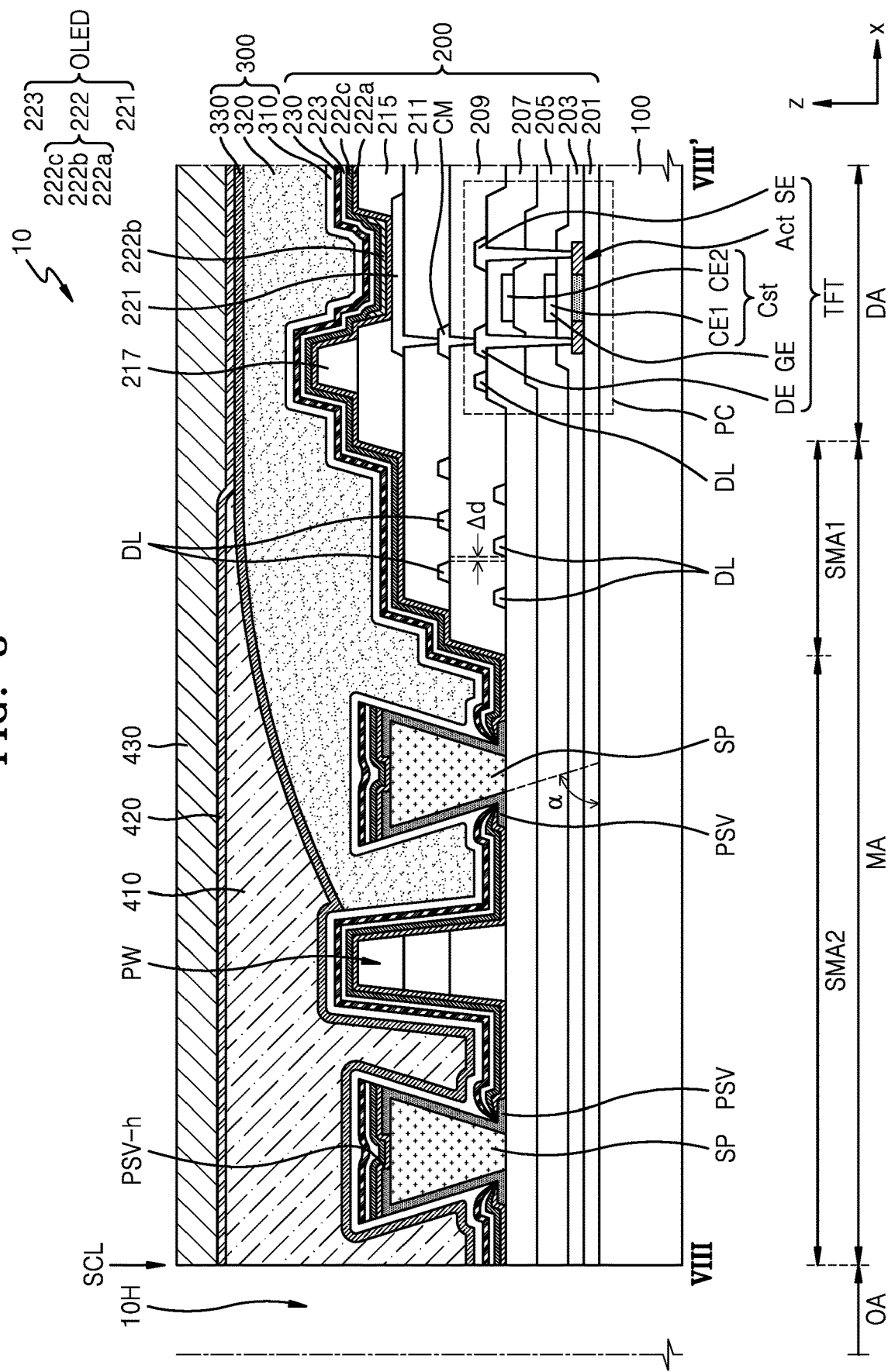
FIG. 8 is a cross-sectional view illustrating the display panel according to an exemplary embodiment of the present disclosure.
Figure 9A:
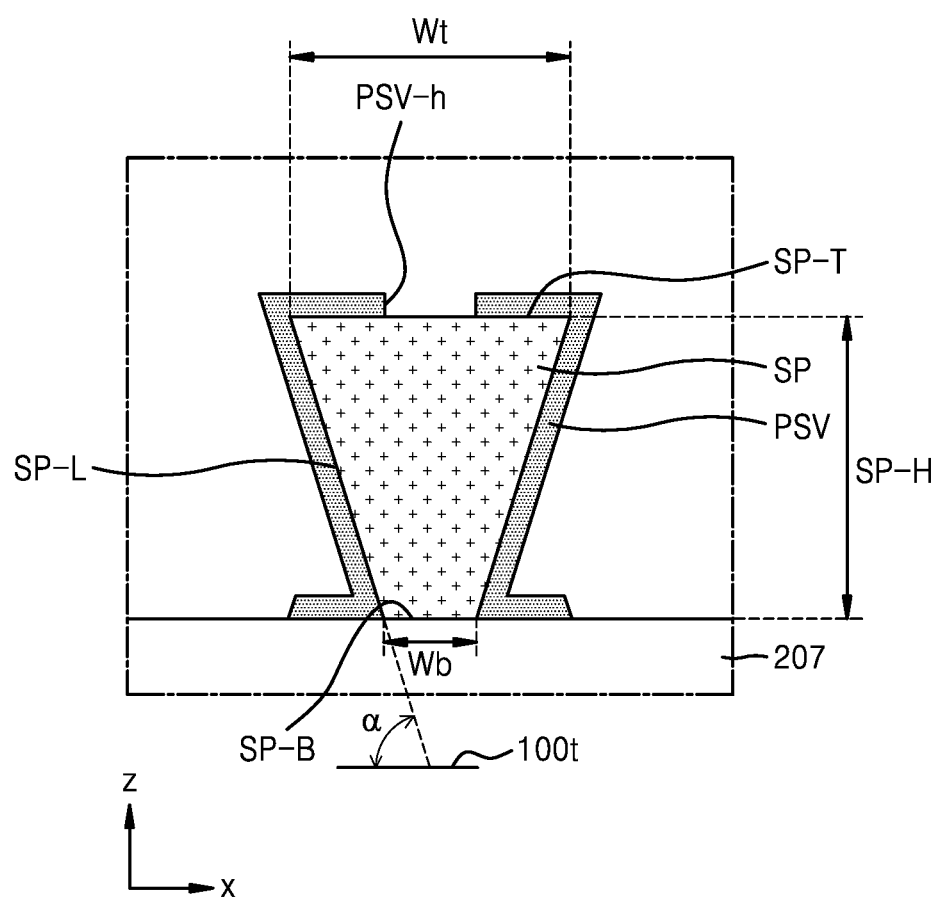
FIGS. 9A and 9B are cross-sectional views illustrating a process of manufacturing a separator of the display panel, according to an exemplary embodiment of the present disclosure.
Figure 9B:
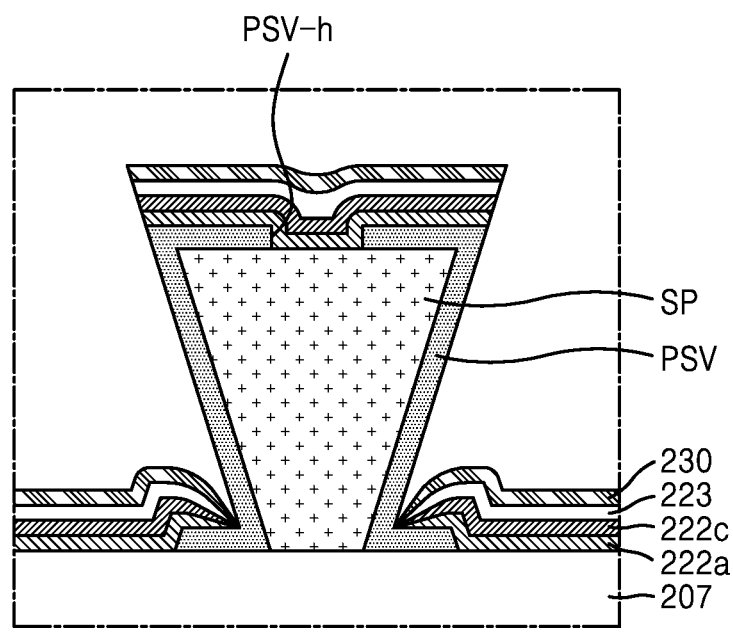

FIG. 8 is a cross-sectional view illustrating the display panel 10 according to an exemplary embodiment of the present disclosure, taken along line VIII-VIII' of FIG. 7. FIGS. 9A and 9B are cross-sectional views illustrating a process of manufacturing the separator SP of the display panel 10 according to an exemplary embodiment of the present disclosure.

Referring to the display area DA of FIG. 8, the substrate 100 may include a glass material or a polymer resin, and, in an exemplary embodiment of the present disclosure, the substrate 100 may have a multi-layer structure as described with reference to FIG. 3A.

A buffer layer 201 for preventing penetration of impurities into a semiconductor layer Act of a TFT may be formed on the substrate 100. The buffer layer 201 may include an inorganic insulating material such as silicon nitride, silicon oxynitride, and/or silicon oxide, and may have a single or multi-layer structure including the inorganic insulating material.

The pixel circuit PC may be located on the buffer layer 201. The pixel circuit PC includes the TFT and the storage capacitor Cst. The TFT may include the semiconductor layer Act, a gate electrode GE, a source electrode SE, and a drain electrode DE. The TFT of FIG. 8 may correspond to a driving TFT of FIG. 6, and the data line DL is electrically connected to a switching TFT included in the pixel circuit PC. Although the TFT is a top-gate TFT in which the gate electrode GE is located on the semiconductor layer Act with a gate insulating layer 203 therebetween in the present embodiment, according to an exemplary embodiment of the present disclosure, the TFT may be a bottom-gate TFT.

The semiconductor layer Act may include polysilicon. Alternatively, the semiconductor layer Act may include amorphous silicon, an oxide semiconductor, and/or an organic semiconductor. The gate electrode GE may include a low resistance metal material. The gate electrode GE may include a conductive material including molybdenum (Mo), aluminum (Al), copper (Cu), and/or titanium (Ti), and may have a single or multi-layer structure including the conductive material.

The gate insulating layer 203 between the semiconductor layer Act and the gate electrode GE may include an inorganic insulating material such as silicon oxide, silicon nitride, silicon oxynitride, aluminum oxide, titanium oxide, tantalum oxide, and/or hafnium oxide. The gate insulating layer 203 may have a single or multi-layer structure including the inorganic insulating material.

The source electrode SE and the drain electrode DE may each be located on the same layer as the data line DL. Each of the source electrode SE, the drain electrode DE, and the data line DL may include a material having high conductivity. Each of the source electrode SE and the drain electrode DE may include a conductive material including Mo, Al, Cu, or Ti, and may have a single or multi-layer structure including the conductive material. In an exemplary embodiment of the present disclosure, each of the source electrode SE, the drain electrode DE, and the data line DL may have a multi-layer structure formed of three-layered structure of Ti/Al/Ti.

The storage capacitor Cst includes a lower electrode CE1 and an upper electrode CE2 overlapping each other with a first interlayer insulating layer 205 therebetween. The storage capacitor Cst may at least partially overlap the TFT. In this regard, in FIG. 8, the gate electrode GE of the TFT is the lower electrode CE1 of the storage capacitor Cst. According to an exemplary embodiment of the present disclosure, the storage capacitor Cst might not overlap the TFT. The storage capacitor Cst may be covered by a second interlayer insulating layer 207. The upper electrode CE2 of the storage capacitor Cst may include a conductive material including Mo, Al, Cu, and/or Ti, and may have a single or multi-layer structure including the conductive material.

Each of the first interlayer insulating layer 205 and the second interlayer insulating layer 207 may include an inorganic insulating material such as silicon oxide, silicon nitride, silicon oxynitride, aluminum oxide, titanium oxide, tantalum oxide, and/or hafnium oxide. Each of the first interlayer insulating layer 205 and the second interlayer insulating layer 207 may have a single or multi-layer structure including the inorganic insulating material.

The pixel circuit PC including the TFT and the storage capacitor Cst may be covered by a first organic insulating layer 209. The first organic insulating layer 209 may have a top surface that is substantially flat (e.g. planar).

The pixel circuit PC may be electrically connected to a pixel electrode 221. For example, as shown in FIG. 8, a contact metal CM may be further located between the TFT and the pixel electrode 221. The contact metal CM may contact the TFT through a contact hole formed in the first organic insulating layer 209, and the pixel electrode 221 may contact the contact metal CM through a contact hole formed in a second organic insulating layer 211 on the contact metal. The contact metal CM may include a conductive material including Mo, Al, Cu, and/or Ti, and may have a single or multi-layer structure including the conductive material. In an exemplary embodiment of the present disclosure, the contact metal CM may have a multi-layer structure formed of Ti/Al/Ti.

Each of the first organic insulating layer 209 and the second organic insulating layer 211 may include an organic insulating material such as a general-purpose polymer (e.g., polymethyl methacrylate (PMMA) or polystyrene (PS)), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. In an exemplary embodiment of the present disclosure, each of the first organic insulating layer 209 and the second organic insulating layer 211 may include PI.

The pixel electrode 221 may be formed on the second organic insulating layer 211. Although the contact metal CM and the second organic insulating layer 211 are included in FIG. 8, according to an exemplary embodiment of the present disclosure, the contact metal CM and the second organic insulating layer 211 may be omitted. In this case, the pixel electrode 221 may be located on the first organic insulating layer 209, and the pixel electrode 221 may be electrically connected to the TFT through a contact hole formed in the first organic insulating layer 209.

The pixel electrode 221 may include a conductive oxide such as indium tin oxide (ITO), indium zinc oxide (IZO), zinc oxide (ZnO), indium oxide ($In_2O_3$), indium gallium oxide (IGO), and/or aluminum zinc oxide (AZO). According to an exemplary embodiment of the present disclosure, the pixel electrode 221 may include a reflective film including silver (Ag), magnesium (Mg), aluminum (Al), platinum (Pt), palladium (Pd), gold (Au), nickel (Ni), neodymium (Nd), iridium (Ir), chromium (Cr), and/or a compound thereof. According to an exemplary embodiment of the present disclosure, the pixel electrode 221 may further include a film formed of ITO, IZO, ZnO, or $In_2O_3$ over and/or under the reflective film.

A pixel-defining film 215 may be formed on the pixel electrode 221. The pixel-defining film 215 may have an opening through which a top surface of the pixel electrode 221 is exposed, and may cover an edge of the pixel electrode 221. The pixel-defining film 215 may include an organic insulating material. Alternatively, the pixel-defining film 215 may include an inorganic insulating material such as silicon nitride, silicon oxynitride, or silicon oxide. Alternatively, the pixel-defining film 215 may include an organic insulating material and/or an inorganic insulating material.

An intermediate layer 222 includes an emission layer 222b. The intermediate layer 222 may include a first functional layer 222a located under the emission layer 222b and/or a second functional layer 222c located over the emission layer 222b. The emission layer 222b may include a high molecular or low molecular weight organic material that emits light of a predetermined color.

The first functional layer 222a may have a single or multi-layer structure. For example, when the first functional layer 222a is formed of a high molecular weight material, the first functional layer 222a that is a hole transport layer (HTL) having a single-layer structure may be formed of poly(3,4-ethylenedioxythiophene) (PEDOT) or polyaniline (PANI). When the first functional layer 222a is formed of a low molecular weight material, the first functional layer 222a may include a hole injection layer (HIL) and/or a hole transport layer (HTL).

The second functional layer 222c may be omitted. For example, the second functional layer 222c is formed when each of the first functional layer 222a and the emission layer 222b is formed of a high molecular weight material. The second functional layer 222c may have a single or multi-layer structure. The second functional layer 222c may include an electron transport layer (ETL) and/or an electron injection layer (EIL).

The emission layer 222b of the intermediate layer 222 may be located for each pixel in the display area DA. The emission layer 222b may be patterned to correspond to the pixel electrode 221 exposed through an opening of the pixel-defining film 215. Unlike the emission layer 222b, the first functional layer 222a and the second functional layer 222c of the intermediate layer 222 may be in the intermediate area MA as well as the display area DA.

A counter electrode 223 may be formed of a conductive material having a low work function. As used herein, the phrase "low work function" may be intended to mean a material having a work function lower than that of silicon. The counter electrode 223 may include a (semi) transparent layer including Ag, Mg, Al, Nd, Ir, Cr, lithium (Li), calcium (Ca), and/or an alloy thereof. For example, the counter electrode 223 may include Li, Ca, LiF/Ca, LiF/Al, Al, Mg or an alloy thereof. Alternatively, the counter electrode 223 may further include a layer formed of ITO, IZO, ZnO, and/or In$_2$O$_3$ located on the (semi) transparent layer including the above material. The counter electrode 223 may also be formed in the intermediate area MA as well as the display area DA. The first functional layer 222a, the second functional layer 222c, and the counter electrode 223 may be formed by using thermal evaporation.

A capping layer 230 may be located on the counter electrode 223. For example, the capping layer 230 may include LiF, and may be formed by using thermal evaporation. In some exemplary embodiments of the present disclosure, the capping layer 230 may be omitted.

A spacer 217 may be formed on the pixel-defining film 215. The spacer 217 may include an organic insulating material such as PI. Alternatively, the spacer 217 may include an inorganic insulating material such as silicon nitride or silicon oxide, or may include an organic insulating material and an inorganic insulating material.

The spacer 217 and the pixel-defining film 215 may include the same material or different materials. For example, the pixel-defining film 215 and the spacer 217 may be formed together by using a mask process using a halftone mask. In an exemplary embodiment of the present disclosure, the pixel-defining film 215 and the spacer 217 may each include PI.

The OLED is covered by the thin-film encapsulation layer 300. The thin-film encapsulation layer 300 may include at least one organic encapsulation layer and at least one inorganic encapsulation layer. In FIG. 8, the thin-film encapsulation layer 300 includes first and second inorganic encapsulation layers 310 and 330 and an organic encapsulation layer 320 located between the first and second inorganic encapsulation layers 310 and 330. According to an exemplary embodiment of the present disclosure, the number of organic encapsulation layers and the number of inorganic encapsulation layers and an order of stacking organic encapsulation layers and inorganic encapsulation layers may be changed.

Each of the first inorganic encapsulation layer 310 and the second inorganic encapsulation layer 330 may include one or more inorganic materials from among aluminum oxide, titanium oxide, tantalum oxide, hafnium oxide, zinc oxide, silicon oxide, silicon nitride, and/or silicon oxynitride. Each of the first inorganic encapsulation layer 310 and the second inorganic encapsulation layer 330 may have a single or multi-layer structure including the one or more inorganic materials. The organic encapsulation layer 320 may include a polymer-based material. Examples of the polymer-based material may include an acrylic resin, an epoxy-based resin, PI, and/or polyethylene.

Thicknesses of the first inorganic encapsulation layer 310 and the second inorganic encapsulation layer 330 may be different from each other. A thickness of the first inorganic encapsulation layer 310 may be greater than a thickness of the second inorganic encapsulation layer 330. For example, a thickness of the first inorganic encapsulation layer 310 may be about 1 μm, and a thickness of the second inorganic encapsulation layer 330 may be about 0.7 μm. Alternatively, a thickness of the second inorganic encapsulation layer 330 may be greater than a thickness of the first inorganic encapsulation layer 310, or thicknesses of the first inorganic encapsulation layer 310 and the second inorganic encapsulation layer 330 may be the same.

Referring to the intermediate area MA of FIG. 8, the intermediate area MA may include a first sub-intermediate area SMA1 that is relatively far from the first area OA and a second sub-intermediate area SMA2 that is relatively close to the first area OA. The separator SP and lines bypassing the first area OA may be located in the intermediate area MA.

The data lines DL may be located in the first sub-intermediate area SMA1. The data lines DL of the first sub-intermediate area SMA1 of FIG. 8 correspond to bypassing portions (e.g., DL-D1 and DL-D2) of FIG. 7. The first sub-intermediate area SMA1 may be a bypassing area or a line area where lines such as the data lines DL bypass.

The data lines DL may be alternately arranged with an insulating layer therebetween. For example, adjacent data lines DL are alternately located so that one of the adjacent data lines DL is located under an insulating layer (e.g., the first organic insulating layer 209) and the other is located over the insulating layer (e.g., the first organic insulating layer 209). When the data lines DL are alternately located with an insulating layer therebetween, a distance (e.g., a pitch Δd) between the data lines DL may be reduced. Although the data lines DL are located in the first sub-intermediate area SMA1 in FIG. 8, the scan lines SL, for example, bypassing portions of the scan lines SL, of FIG. 7 may also be located in the first sub-intermediate area SMA1.

One or more separators SP may be located in the second sub-intermediate area SMA2. In the second sub-intermediate area SMA2, where the separator SP is located, an organic layer included in the intermediate layer 222 may be disconnected (or separated) by the separator SP. The second sub-intermediate area SMA2 may be a separator area or an organic layer-disconnecting (or separating) area.

The separator SP may be located on an insulating layer, for example, the second interlayer insulating layer 207, in the second sub-intermediate area SMA2. The separator SP may disconnect and/or separate at least one organic layer of the OLED. For example, the separator SP may disconnect and/or separate the first functional layer 222a and/or the second functional layer 222c extending to the intermediate area MA. The counter electrode 223 and/or the capping layer 230 may also be disconnected, like the first functional layer 222a and/or the second functional layer 222c.

The first functional layer 222a, the second functional layer 222c, and/or the counter electrode 223 may be entirely formed on the substrate 100 by using thermal evaporation. The separator SP may be formed before a process of forming the first functional layer 222a, the second functional layer 222c, and the counter electrode 223. The first functional layer 222a, the second functional layer 222c, and/or the counter electrode 223 deposited after the separator SP is formed may have a disconnected (separated) structure due to a shape of the separator SP. The capping layer 230 including LiF may also have a disconnected (separated) structure due to a shape of the separator SP.

A disconnected (separated) structure of the first functional layer 222a, the second functional layer 222c, the counter electrode 223, and/or the capping layer 230 due to the separator SP will be described as follows.

FIG. 9A is a cross-sectional view illustrating a state before the first functional layer 222a, the second functional layer 222c, the counter electrode 223, and/or the capping layer 230 is deposited. FIG. 9B is a cross-sectional view illustrating a state after the first functional layer 222a, the second functional layer 222c, the counter electrode 223, and/or the capping layer 230 is deposited.

Referring to FIG. 9A, the separator SP has a shape in which a width Wt of a top surface SP-T is greater than a width Wb of a bottom surface SP-B. A side surface SP-L of the separator SP that connects the top surface SP-T and the bottom surface SP-B may include a reverse-tapered inclined surface. In this regard, in FIG. 9A, the side surface SP-L of the separator SP includes one reverse-tapered inclined surface and the separator SP has an inverted trapezoidal cross-sectional shape. An angle α formed between the reverse-tapered inclined surface and a top surface 100t of the substrate may be equal to or less than 30°. A thickness SP—H of the separator SP may be equal to or greater than about 3 μm.

The separator SP may include an organic material. The separator SP may include an organic material different from that of the first organic insulating layer 209 and the second organic insulating layer 211. The separator SP may include a photosensitive resin, for example, a negative photoresist.

The separator SP may be covered by an inorganic layer PSV, and the inorganic layer PSV may include at least one hole PSV-h corresponding to the top surface SP-T of the separator SP. The hole PSV-h may be a path through which a gas generated by the separator SP including an organic material is discharged during and/or after a process of manufacturing the display panel 10. The hole PSV-h may be an outgassing path.

A body of the inorganic layer PSV excluding the hole PSV-h may cover a part of the top surface SP-T of the separator SP and the side surface SP-L of the separator SP. The body of the inorganic layer PSV may extend from the top surface SP-T of the separator SP to cover the side surface SP-L, and may contact a top surface of an insulating layer, for example, the second interlayer insulating layer 207, located under the separator SP.

Referring to FIG. 9B, after the separator SP and the inorganic layer PSV are formed, the first functional layer 222a, the second functional layer 222c, the counter electrode 223, and/or the capping layer 230 may be formed as described above. Each of the first functional layer 222a, the second functional layer 222c, the counter electrode 223, and/or the capping layer 230 may be integrally formed in the display area DA and the intermediate area MA. Because the separator SP is located in the intermediate area MA, the first functional layer 222a and/or the second functional layer 222c may be disconnected by the separator SP. Likewise, the counter electrode 223 may be disconnected by the separator SP, and the capping layer 230 including a material such as LiF may be disconnected by the separator SP.

A layer including an organic material from among layers formed on the substrate 100 may be a path through which a foreign material such as moisture penetrates. The foreign material such as moisture may damage the OLED. According to an exemplary embodiment of the present disclosure, because the first functional layer 222a and/or the second functional layer 222c including an organic material is disconnected by the separator SP, it is possible to minimize moisture penetration in a direction (e.g., a lateral direction or the x-direction) parallel to a top surface of the first functional layer 222a and/or the second functional layer 222c.

In an exemplary embodiment of the present disclosure, a shadow area may exist around the separator SP having the reverse-tapered inclined surface. The shadow area may be formed by the reverse-tapered inclined surface of the separator SP. The first functional layer 222a, the second functional layer 222c, the counter electrode 223, and/or the capping layer 230 may be difficult to be deposited in the shadow area around the separator SP. In and/or around the shadow area, ends of the first functional layer 222a, the second functional layer 222c, the counter electrode 223, and/or the capping layer 230 may have any of various cross-sectional shapes according to a deposition condition. For example, the ends of the first functional layer 222a, the second functional layer 222c, the counter electrode 223, and/or the capping layer 230 may have a small thickness around the separator SP. Positions and cross-sectional shapes of the ends of the first functional layer 222a, the second functional layer 222c, the counter electrode 223, and/or the capping layer 230 may vary according to the deposition condition (e.g., a time, a deposition direction, and a material).

In a comparative example, when there is no inorganic layer PSV on the separator SP, ends of a first functional layer and/or a second functional layer including an organic material may contact a side surface (i.e., reverse-tapered inclined side surface) of a separator including an organic material according to a process condition (e.g., a deposition time or an angle of incidence of a deposited material). The first functional layer (including the organic material) and the separator (including the organic material) contacting each other and/or the second functional layer (including the organic material) and the separator (including the organic material) contacting each other may form a path through which new moisture penetrates. According to an exemplary embodiment of the present disclosure, however, because the inorganic layer PSV located on the separator SP covers the side surface SP-L of the separator SP, the ends of the first functional layer 222a and/or the second functional layer 222c may be prevented from contacting the separator SP. Accordingly, the first functional layer 222a and/or the second functional layer 222c formed of an organic material and the separator SP formed of an organic material may be prevented from contacting each other and forming a moisture penetration path.

Because the separator SP is located under the inorganic layer PSV and the first functional layer 222a and/or the second functional layer 222c is located over the inorganic layer PSV, the separator SP may be spaced apart from the first functional layer 222a and/or the second functional layer 222c by the inorganic layer PSV in a lateral direction (x direction). The lateral surface of the separator SP might not contact the first functional layer 222a and/or the second functional layer 222c. Likewise, the counter electrode 223 and/or the capping layer 230 may also be separated from the separator SP by the inorganic layer PSV and might not contact the separator SP.

The inorganic layer PSV may include a metal or an inorganic insulating material. For example, the inorganic layer PSV may include a transparent conductive oxide (TCO) such as ITO and/or a metal layer. Alternatively, the inorganic layer PSV may include an inorganic insulating layer such as silicon oxide, silicon nitride, or silicon oxynitride.

Referring back to FIG. 8, when the plurality of separators SP are located on the substrate 100, the separators SP may be spaced apart from one another and a partition wall PW may be located between the separators SP. A height of the separators SP may be equal to or less than a height of the partition wall PW. The height of the separators SP and the height of the partition wall PW may be respectively a vertical distance between a top surface of the substrate 100 and a top surface of the separator SP and a vertical distance between the top surface of the substrate 100 and a top surface of the partition wall PW.

The organic encapsulation layer 320 may be formed by applying a monomer to the substrate 100 and then curing the monomer. The partition wall PW may control the flow of the monomer, and may adjust a thickness of the monomer, for example, a thickness of the organic encapsulation layer 320. An end of the organic encapsulation layer 320 may be located at a side of the partition wall PW. The partition wall PW may include the same material as that of the first organic insulating layer 209, the second organic insulating layer 211, and/or the pixel-defining film 215.

The separator SP located relatively close to the display area DA, for example, the separator SP located between the partition wall PW and the OLED of the display area DA, may be covered by the organic encapsulation layer 320.

The first inorganic encapsulation layer 310 located under the organic encapsulation layer 320 may be formed by using chemical vapor deposition (CVD). Because the first inorganic encapsulation layer 310 has relatively good step coverage, unlike the first functional layer 222a, the second functional layer 222c, the counter electrode 223, and/or the capping layer 230, the first inorganic encapsulation layer 310 may be continuously formed without being disconnected. For example, the first inorganic encapsulation layer 310 may be continuously formed to cover a top surface and a side surface of the separator SP. The first inorganic encapsulation layer 310 may cover a stack of the first functional layer 222a, the second functional layer 222c, the counter electrode 223, and/or the capping layer 230, which are disconnected by the separator SP.

The second inorganic encapsulation layer 330 is located on the organic encapsulation layer 320. The second inorganic encapsulation layer 330 may entirely cover the substrate 100, like the first inorganic encapsulation layer 310. A portion of the second inorganic encapsulation layer 330 may directly contact the first inorganic encapsulation layer 310 in the second sub-intermediate area SMA2. For example, the second inorganic encapsulation layer 330 may directly contact the first inorganic encapsulation layer 310 in an area between the first area OA and an end of the organic encapsulation layer 320.

A planarization layer 410 may be located on the thin-film encapsulation layer 300. The planarization layer 410 may increase flatness of the display panel 10 by covering a portion of the intermediate area MA where the organic encapsulation layer 320 does not exist. Accordingly, an input sensing layer and/or an optical functional layer directly formed on the display panel 10 or coupled to the display panel 10 with an adhesive layer may be prevented from being separated from the display panel 10. A portion of the planarization layer 410 may overlap a portion of the organic encapsulation layer 320.

The planarization layer 410 may include an organic insulating material. In an exemplary embodiment of the present disclosure, the planarization layer 410 may be formed by applying a photoresist (e.g., a negative or positive photoresist) or a polymer-based organic material to the thin-film encapsulation layer 300 and patterning the photoresist or the polymer-based organic material. In an exemplary embodiment of the present disclosure, the planarization layer 410 may be located only in the intermediate area MA. In a plan view, the planarization layer 410 may have a loop shape at least partially surrounding the first area OA.

A first upper insulating layer 420 and a second upper insulating layer 430 may be formed on the planarization layer 410. The first upper insulating layer 420 may include an inorganic insulating layer, and the second upper insulating layer 430 may include an organic insulating layer. In an exemplary embodiment of the present disclosure, when the input sensing layer 40 (see FIG. 2A) is directly formed on the display panel 10, the first upper insulating layer 420 and the second upper insulating layer 430 may be integrally formed with an insulating layer included in the input sensing layer 40. For example, each of the first upper insulating layer 420 and the second upper insulating layer 430 may be an insulating layer included in the input sensing layer 40.

The display panel 10 may have the first opening 10H corresponding to the first area OA. The first opening 10H may be formed by forming the above elements on the substrate 100 and then performing a cutting or scribing process along a first line SCL. A side surface of the first opening 10H may include a side surface of the substrate 100 and side surfaces of layers stacked on the substrate 100 which are exposed through the first opening 10H.

Although the separator SP of FIG. 8 is directly located on the second interlayer insulating layer 207 that is an inorganic insulating layer, the present disclosure is not limited thereto. According to an exemplary embodiment of the present disclosure, an element having any of various structures may be located under the separator SP as described below with reference to FIGS. 10 and 11.

Figure 10:
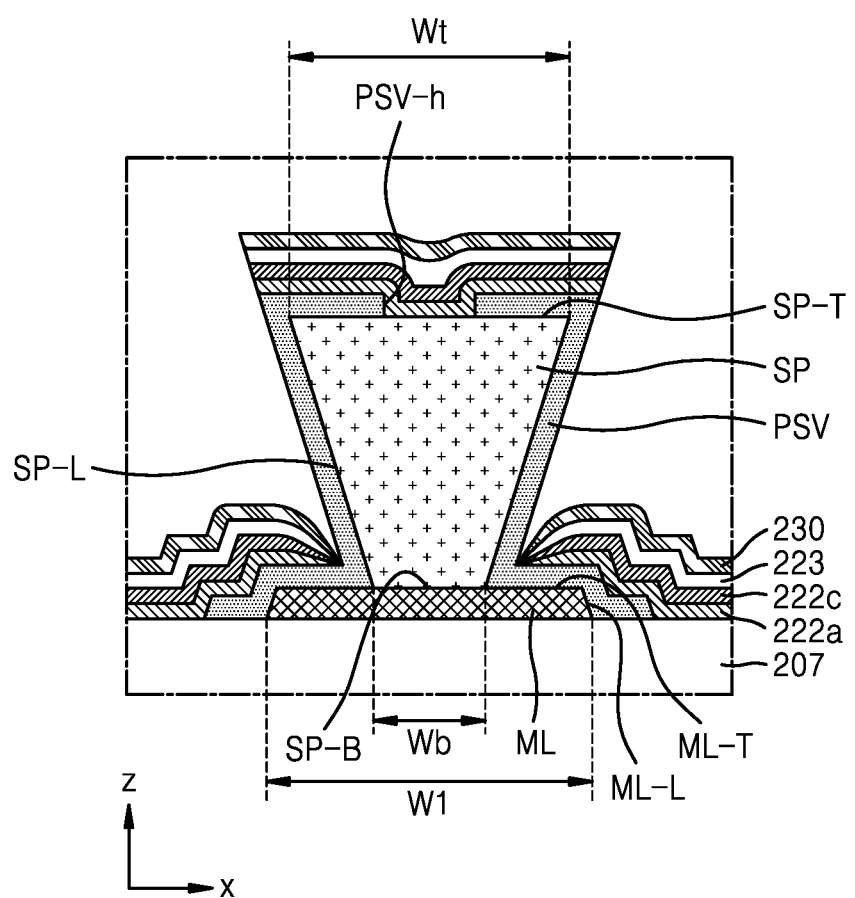
FIG. 10 is a cross-sectional view illustrating the separator and a structure around the separator according to an exemplary embodiment of the present disclosure.

FIG. 10 is a cross-sectional view illustrating the separator SP and a structure around the separator SP according to an exemplary embodiment of the present disclosure. In FIG. 10, elements over the capping layer 230, for example, the thin-film encapsulation layer 300 of FIG. 8 and elements over the thin-film encapsulation layer 300, are not shown for convenience of explanation.

Referring to FIG. 10, a metal layer ML may be located under the separator SP. The metal layer ML is located between an inorganic insulating layer (e.g., the second interlayer insulating layer 207) and the separator SP. The separator SP may directly contact a top surface of the metal layer ML. An adhesive force between the metal layer ML and the separator SP may be greater than an adhesive force between the inorganic insulating layer (e.g., the second interlayer insulating layer 207) and the separator SP.

The metal layer ML may include the same material as that of the source electrode SE and the drain electrode DE of the pixel circuit PC, and the data line DL of FIG. 8. Alternatively, the metal layer ML may include the same material as that of the contact metal CM of FIG. 8.

The separator SP may include a photosensitive material such as a negative photoresist, and a process of forming the separator SP including the photosensitive material may include exposure, development, and baking. During an exposure process for forming the separator SP, light may be reflected by the metal layer ML. Considering the reflection of light by the metal layer ML, a width W1 of the metal layer ML may be equal to or greater than the width Wt of the top surface SP-T of the separator SP (Wb<Wt≤W1).

The inorganic layer PSV may cover a part of the top surface SP-T and the side surface SP-L of the separator SP, and may cover the metal layer ML. The inorganic layer PSV may cover the separator SP and the metal layer ML and may extend to an inorganic insulating layer (e.g., the second interlayer insulating layer 207) located under the metal layer M L. The inorganic layer PSV may contact a part of the top surface SP-T and the side surface SP-L of the separator SP, may contact a part of a top surface ML-T and a side surface ML-L of the metal layer ML, and may contact the second interlayer insulating layer 207. A portion of the top surface SP-T of the separator SP not covered by the inorganic layer PSV corresponds to a position of the hole PSV-h for outgassing.

Figure 11:
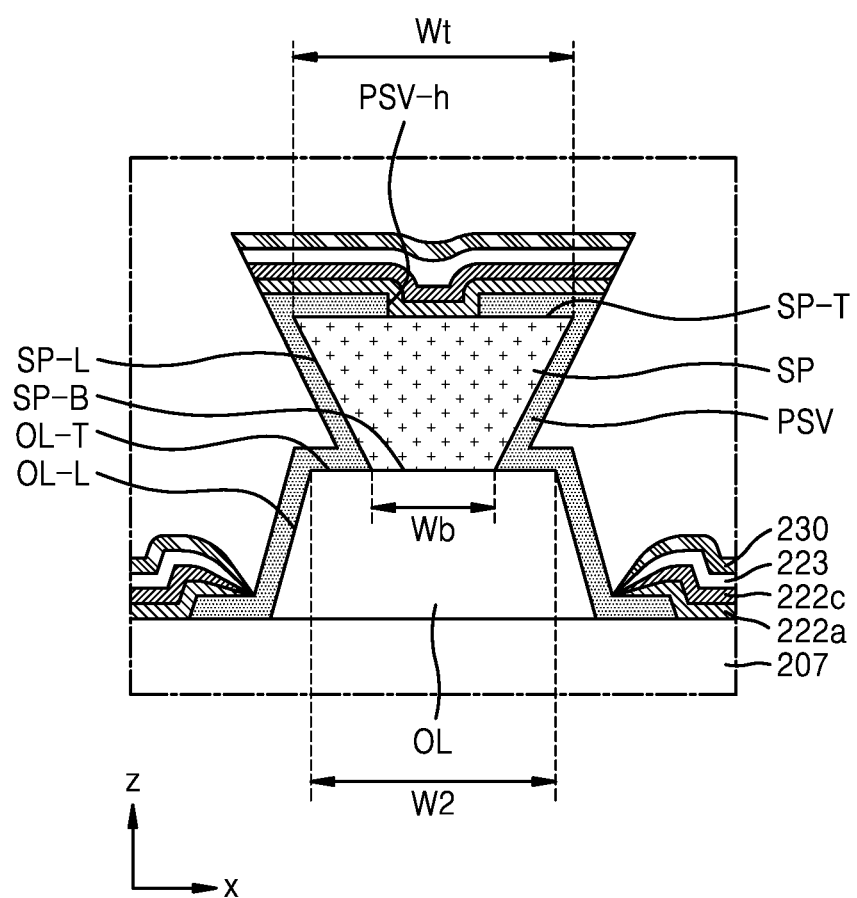
FIG. 11 is a cross-sectional view illustrating the separator and a structure around the separator according to an exemplary embodiment of the present disclosure.

FIG. 11 is a cross-sectional view illustrating the separator SP and a structure around the separator SP according to an exemplary embodiment of the present disclosure. In FIG. 11, elements over the capping layer 230, for example, the thin-film encapsulation layer 300 and elements over the thin-film encapsulation layer 300 of FIG. 8, are not shown for convenience of explanation.

Referring to FIG. 11, an organic layer OL may be located under the separator SP. The organic layer OL is located between an inorganic insulating layer (e.g., the second interlayer insulating layer 207) and the separator SP. The separator SP may directly contact a top surface of the organic layer OL. An adhesive force between the organic layer OL and the separator SP may be greater than an adhesive force between the inorganic insulating layer (e.g., the second interlayer insulating layer 207) and the separator SP.

The organic layer OL may include the same material as that of the first organic insulating layer 209 or the second organic insulating layer 211 of FIG. 8. The organic layer OL may be formed by using the same process as that of the first organic insulating layer 209 or the second organic insulating layer 211. The organic layer OL may be patterned to be located under the separator SP. In a plan view, the separator SP may have a loop shape at least partially surrounding the first area OA as described with reference to FIG. 7. The organic layer OL may also have a loop shape at least partially surrounding the first area OA in the plan view, like the separator SP. A width W2 of a top surface OL-T of the organic layer OL may be equal to or greater than the width Wb of the bottom surface SP-B of the separator SP.

The inorganic layer PSV may cover a part of the top surface SP-T and the side surface SP-L of the separator SP, and may cover the organic layer OL. The inorganic layer PSV may cover the separator SP and the organic layer OL, and may extend to an inorganic insulating layer (e.g., the second interlayer insulating layer 207) located under the organic layer OL. The inorganic layer PSV may contact a part of the top surface SP-T and the side surface SP-L of the separator SP, may contact a part of the top surface OL-T and a side surface OL-L of the organic layer OL, and may contact the second interlayer insulating layer 207. A portion of the top surface SP-T of the separator SP not covered by the inorganic layer PSV corresponds to a position of the hole PSV-h for outgassing.

Because the inorganic layer PSV covers the organic layer OL, ends of the first functional layer 222a, the second functional layer 222c, the counter electrode 223, and/or the capping layer 230 may be prevented from contacting the organic layer OL. In a comparative example, when the ends of the first functional layer 222a and the second functional layer 222c formed of an organic material contact the organic layer OL, a penetration path may be formed. According to an exemplary embodiment of the present disclosure, however, the inorganic layer PSV is located between the organic layer OL and the first functional layer 222a and the second functional layer 222c, and thus such a penetration path may be prevented from being formed.

Although the side surface SP-L of the separator SP has an inverted trapezoidal shape having one inclined surface, that is, one reverse-tapered inclined surface, in FIGS. 8 through 11, the present disclosure is not limited thereto. According to an exemplary embodiment of the present disclosure, the side surface SP-L of the separator SP may include a plurality of inclined surfaces having different inclination angles.

Figure 12A:
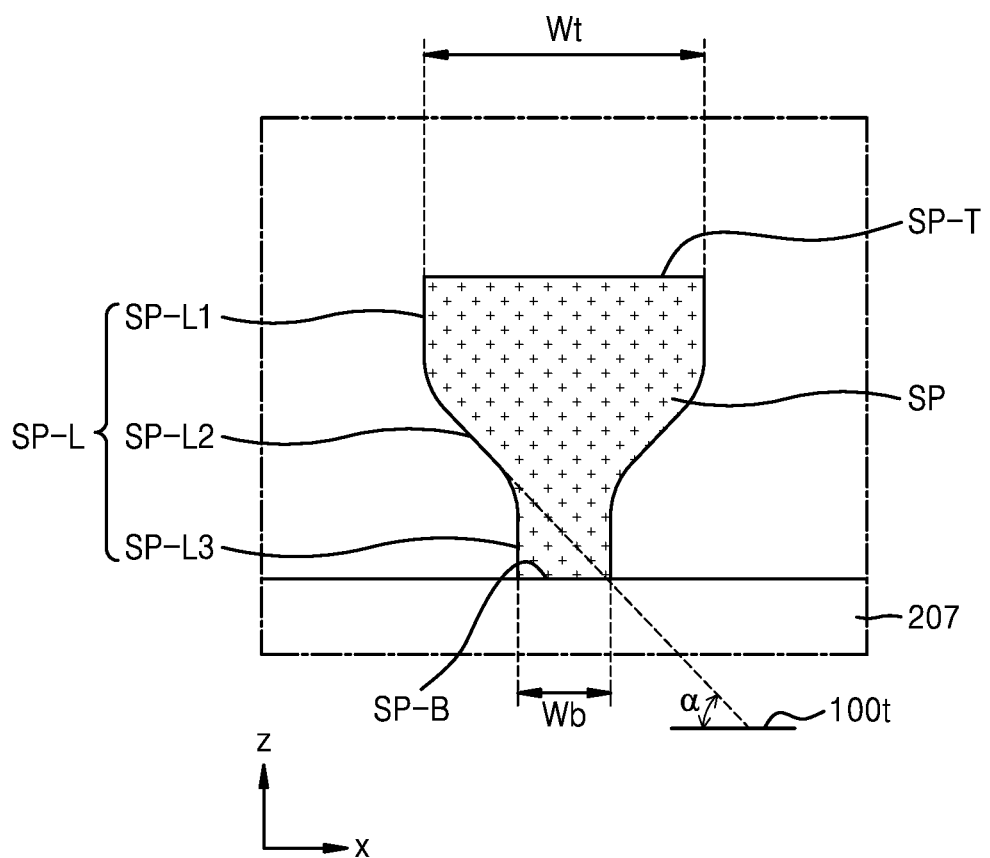
FIGS. 12A through 12C are cross-sectional views illustrating the separator according to an exemplary embodiment of the present disclosure.
Figure 12B:
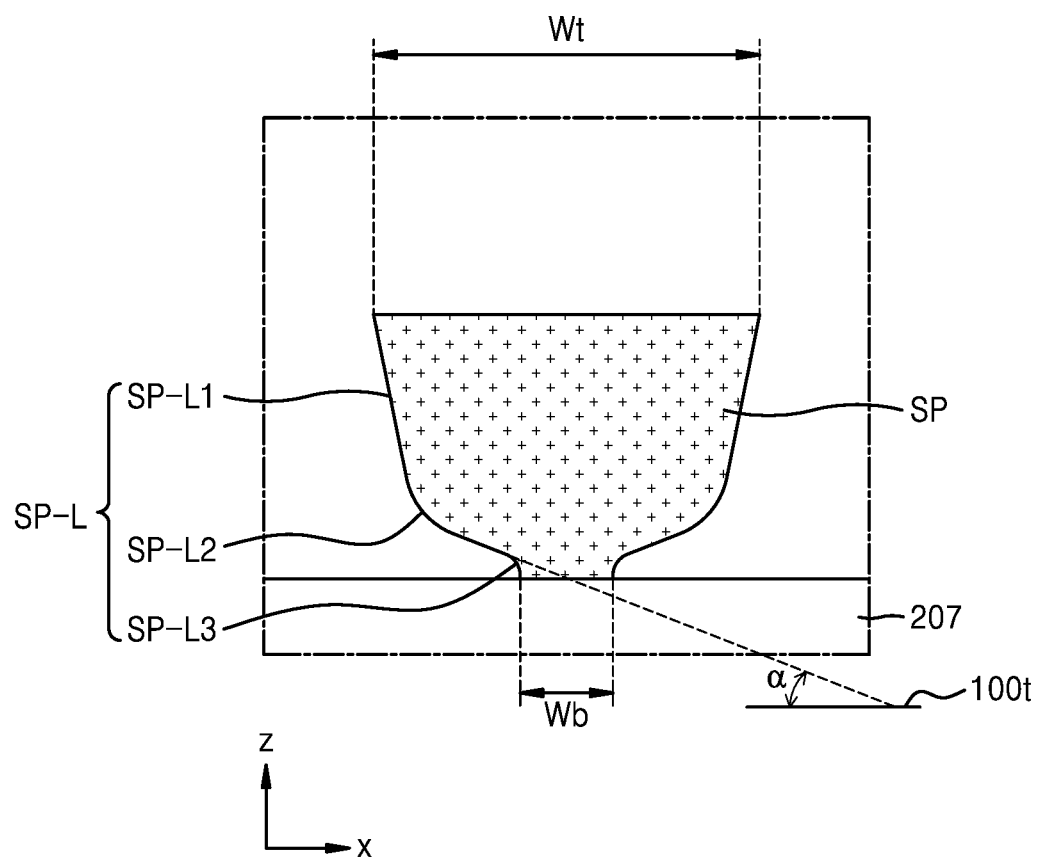
Figure 12C:
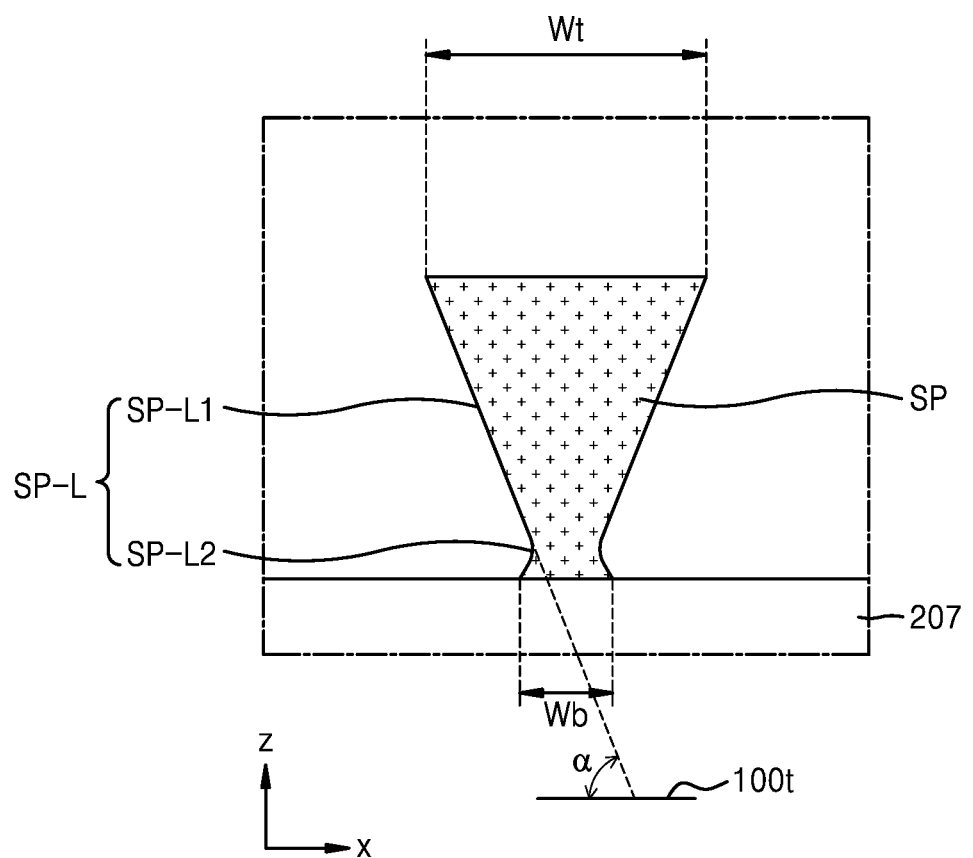

FIGS. 12A through 12C are cross-sectional views of the separator SP according to an exemplary embodiment of the present disclosure.

Referring to FIG. 12A, the width Wt of the top surface SP-T of the separator SP may be greater than the width Wb of the bottom surface SP-B of the separator SP, and the side surface SP-L may include a plurality of sub-side surfaces. For example, the side surface SP-L of the separator SP may include a first sub-side surface SP-L1, a second sub-side surface SP-L2, and a third sub-side surface SP-L3. The first sub-side surface SP-L1, the second sub-side surface SP-L2, and the third sub-side surface SP-L3 having different inclination angles may be formed in a direction from the top surface SP-T to the bottom surface SP-B of the separator SP.

In an exemplary embodiment of the present disclosure, an inclination angle of the second sub-side surface SP-L2 may be less than an inclination angle of the first sub-side surface SP-L1, and an inclination angle of the third sub-side surface SP-L3 may be greater than the inclination of the second sub-side surface SP-L2. The inclination angles of the first sub-side surface SP-L1, the second sub-side surface SP-L2, and the third sub-side surface SP-L3 may be angles formed between the top surface 100t of the substrate 100 and the first sub-side surface SP-L1, the second sub-side surface SP-L2, and the third sub-side surface SP-L3.

At least one of the first sub-side surface SP-L1, the second sub-side surface SP-L2, and the third sub-side surface SP-L3 may be a reverse-tapered inclined surface. At least one of the first sub-side surface SP-L1, the second sub-side surface SP-L2, and the third sub-side surface SP-L3 may be equal to or less than about 30°. For example, the inclination angle α of the second sub-side surface SP-L2 may be equal to or less than 30°.

Although the inclination angle of the first sub-side surface SP-L1 is about 90° in FIG. 12A, according to an exemplary embodiment of the present disclosure, as shown in FIG. 12B, the inclination angle of the first sub-side surface SP-L1 may be an acute angle with respect to the top surface 100t of the substrate.

Although the side surface SP-L of the separator SP includes a plurality of reverse-tapered inclined surfaces in FIGS. 12A and 12B, the present disclosure is not limited thereto. As shown in FIG. 12C, the side surface SP-L of the separator SP may include the first sub-side surface SP-L1 having a reverse-tapered shape and the second sub-side surface SP-L2 having a forward-tapered shape. The inclination angle α of the first sub-side surface SP-L1 having the reverse-tapered shape may be equal to or less than 30°. A length of the first sub-side surface SP-L1 may be greater than that of the second sub-side surface SP-L2.

A structure of the separator SP according to embodiments of FIGS. 12A through 12C or embodiments derived therefrom may be applied to embodiments of FIGS. 8 through 11 and embodiments derived therefrom, and may also be applied to embodiments of FIGS. 13 through 21 and embodiments derived therefrom.

Figure 13:
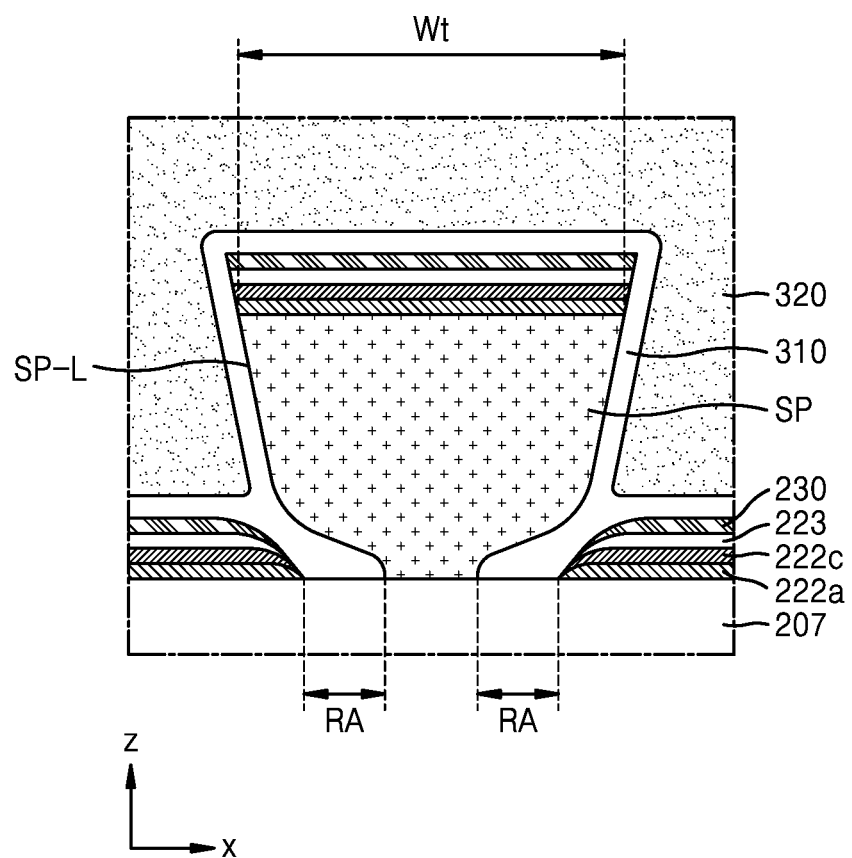
FIGS. 13 through 15 are cross-sectional views illustrating a part of the display panel according to an exemplary embodiment of the present disclosure.
Figure 14:
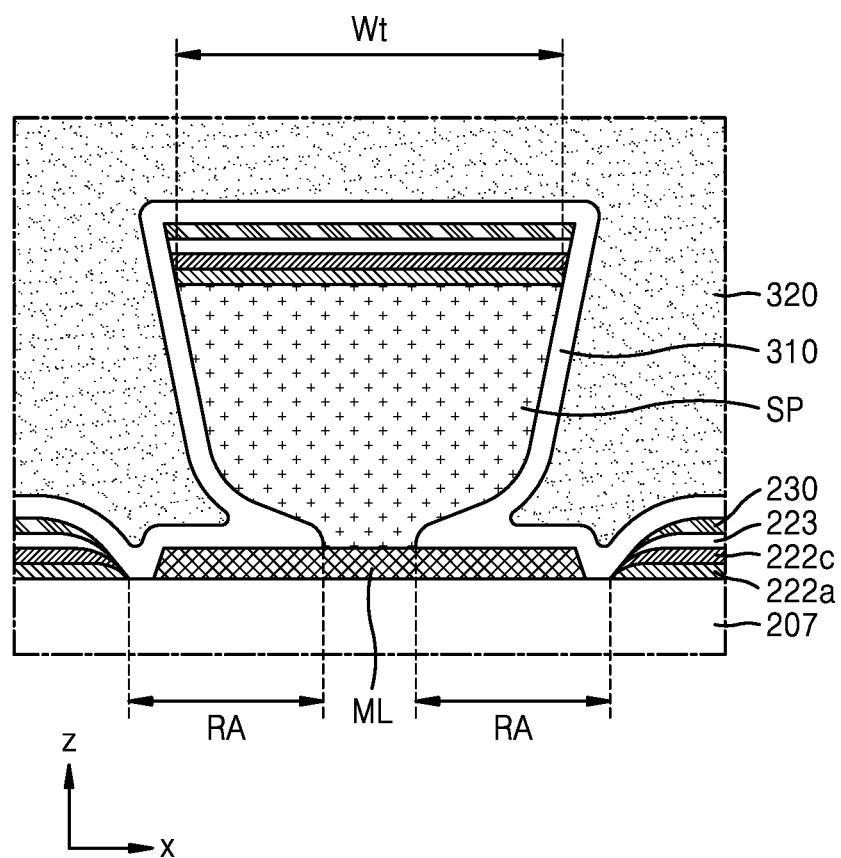
Figure 15:
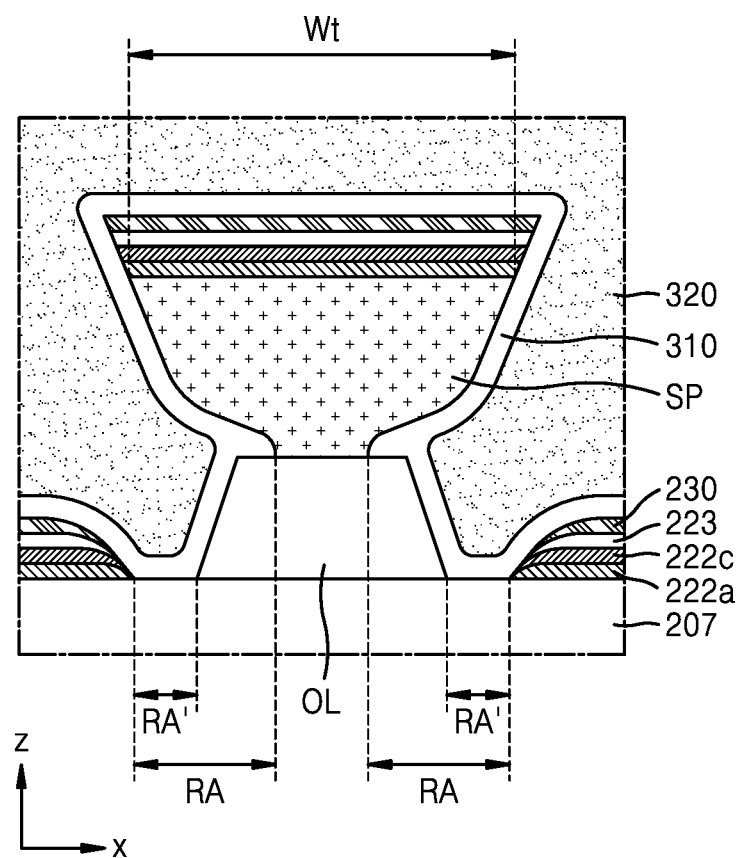

FIGS. 13 through 15 are cross-sectional views illustrating a part of the display panel 10 according to an exemplary embodiment of the present disclosure.

The separator SP may have any desired shape. For example, the side surface SP-L of the separator SP may include a plurality of inclined surfaces, may have a relatively small inclination angle (e.g., equal to or less than 20° or equal to or less than 15°), and/or may include a reverse-tapered inclined surface and a forward-tapered inclined surface that are alternately formed.

When a shadow area is formed widely due to a shape of the separator SP, as shown in FIG. 13, ends of the first functional layer 222a, the second functional layer 222c, the counter electrode 223, and/or the capping layer 230 may be spaced apart from each other due to the separator SP by a predetermined interval.

For example, the first inorganic encapsulation layer 310 may be formed on the first functional layer 222a, the second functional layer 222c, the counter electrode 223, and/or the capping layer 230 that are disconnected (separated) by the separator SP. The first inorganic encapsulation layer 310 may directly contact the side surface SP-L of the separator SP. Also, the first inorganic encapsulation layer 310 may directly contact the second interlayer insulating layer 207 that is an inorganic insulating layer in a first separation area RA between the separator SP and ends of the first functional layer 222a, the second functional layer 222c, the counter electrode 223, and/or the capping layer 230.

Referring to FIG. 14, the metal layer ML may be located under the separator SP. A width of the metal layer ML may be equal to or greater than the width Wt of a top surface of the separator SP as described with reference to FIG. 10. In the first separation area RA between the separator SP and ends of the first functional layer 222a, the second functional layer 222c, the counter electrode 223, and/or the capping layer 230, the first inorganic encapsulation layer 310 may contact the metal layer ML.

Referring to FIG. 15, the organic layer OL may be located under the separator SP. A width of the organic layer OL may be less than the width Wt of the top surface of the separator SP. The organic layer OL may be formed so that a second separation area RA' is formed between the organic layer OL and ends of the first functional layer 222a, the second functional layer 222c, the counter electrode 223, and/or the capping layer 230. A width of the second separation area RA' may be equal to a width of the first separation area RA, or may be greater than or equal to 0.7, 0.8, or 0.9 times a width of the first separation area RA.

Figure 16:
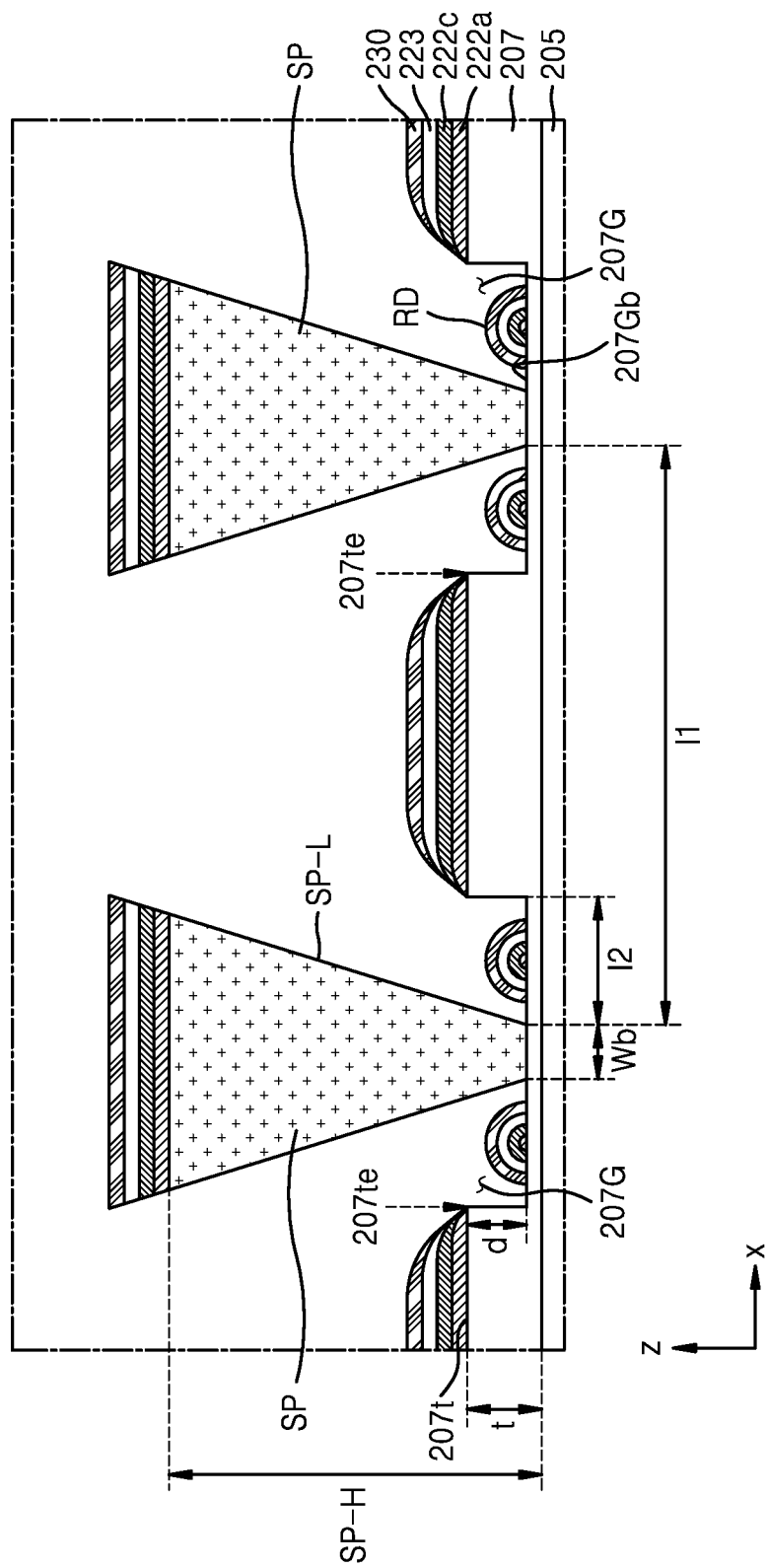
FIG. 16 is a cross-sectional view illustrating a part of the display panel according to an exemplary embodiment of the present disclosure.

FIG. 16 is a cross-sectional view illustrating a part of the display panel 10 according to an exemplary embodiment of the present disclosure. In FIG. 16, the thin-film encapsulation layer 300 and elements over the thin-film encapsulation layer 300 are not shown for convenience of explanation.

At least one insulating layer located under the separator SP may include a groove (or a trench). In this regard, in FIG. 16, the second interlayer insulating layer 207 under the separator SP includes a groove 207G. The second interlayer insulating layer 207 may have a single-layer structure, or a multi-layer structure including a silicon nitride layer and a silicon oxide layer. A depth d of the groove 207G may be less than a thickness t of the second interlayer insulating layer 207. The groove 207G may be formed by using a halftone mask or the like.

A top surface 270t of the second interlayer insulating layer 207 and a bottom surface 207Gb of the groove 207G form a stepped structure due to the groove 207G. Due to the stepped structure, the first functional layer 222a, the second functional layer 222c, the counter electrode 223, and/or the capping layer 230 may be more effectively disconnected. For example, ends of the first functional layer 222a, the second functional layer 222c, the counter electrode 223, and/or the capping layer 230 may be located at an edge 207te of the top surface 207t of the second interlayer insulating layer 207, and a residue RD may be located in the groove 207G.

A deposition material obliquely incident in a deposition process of forming the first functional layer 222a, the second functional layer 222c, the counter electrode 223, and/or the capping layer 230 may be located in the groove 207G to form the residue RD. Due to the stepped structure of the second interlayer insulating layer 207, the residue RD and the ends of the first functional layer 222a, the second functional layer 222c, the counter electrode 223, and/or the capping layer 230 may be spaced apart from each other. According to an exemplary embodiment of the present disclosure, even when the residue RD including an organic material contacts the separator SP including an organic material, the separator SP and the ends of the first functional layer 222a, the second functional layer 222c, the counter electrode 223, and/or the capping layer 230 may be kept spaced apart from each other, thereby effectively preventing damage to an organic light-emitting device due to moisture penetration.

The moisture penetration may be more effectively prevented when at least one of the following conditions is satisfied:

The side surface SP-L of the separator SP may include an inclined surface whose angle is equal to or less than 30° (condition 1). A sum (I1+Wb) of a first separation distance I1 between adjacent separators SP and the width Wb of the bottom surface of the separator SP may be equal to or greater than about 6 μm (condition 2). The thickness SP—H of the separator SP may be equal to or greater than about 3 μm (condition 3), and/or a second separation distance I2 between an inner surface of the second interlayer insulating layer 207 defining the groove 207G and the side surface SP-L of the separator SP facing the inner surface of the second interlayer insulating layer 207 may be equal to or greater than about 2 μm (condition 4).

When all of the conditions are satisfied, ends of the first functional layer 222a, the second functional layer 222c, the counter electrode 223, and/or the capping layer 230 may be spaced apart from the separator SP without being affected by a condition of a deposition process of forming the first functional layer 222a, the second functional layer 222c, the counter electrode 223, and/or the capping layer 230, and the moisture penetration may be effectively prevented. The conditions may be modified and applied to embodiments which are explained of FIGS. 8 through 15 and embodiments derived therefrom, and may also be applied to embodiments of FIGS. 17 through 21 and embodiments derived therefrom.

Figure 17:
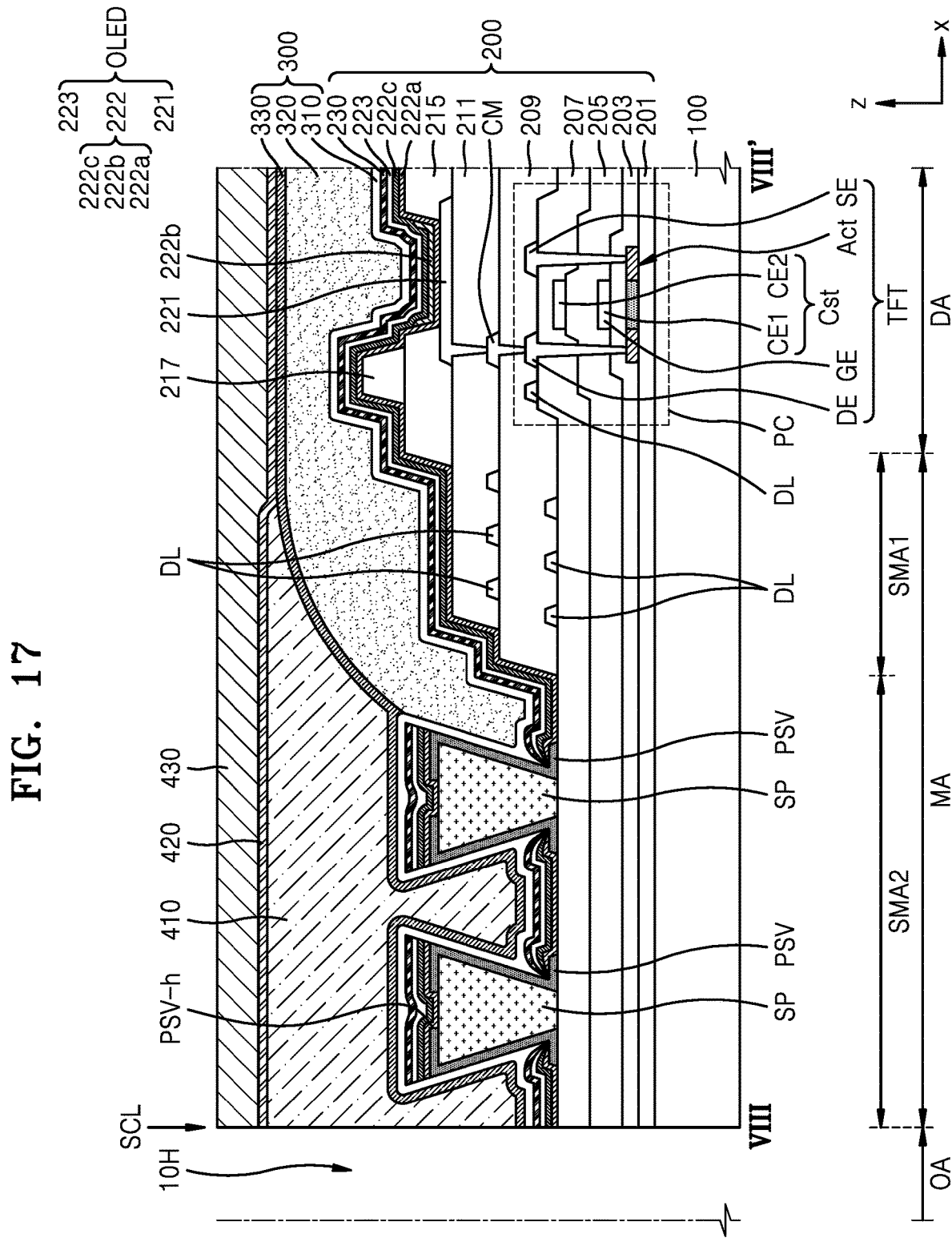
FIG. 17 is a cross-sectional view illustrating the display panel according to an exemplary embodiment of the present disclosure.

FIG. 17 is a cross-sectional view illustrating the display panel 10 according to an exemplary embodiment of the present disclosure. Although the partition wall PW of FIG. 8 is located between adjacent separators SP and an end of the organic encapsulation layer 320 is located at a side of the partition wall PW in the display panel 10, the separator SP of FIG. 17 may perform a function of the partition wall PW of FIG. 8. An end of the organic encapsulation layer 320 may be located at a side of one separator SP.

The feature described with reference to FIG. 17 may be applied to embodiments of FIGS. 8 through 16 and/or embodiments of FIGS. 18 through 21.

Figure 18:
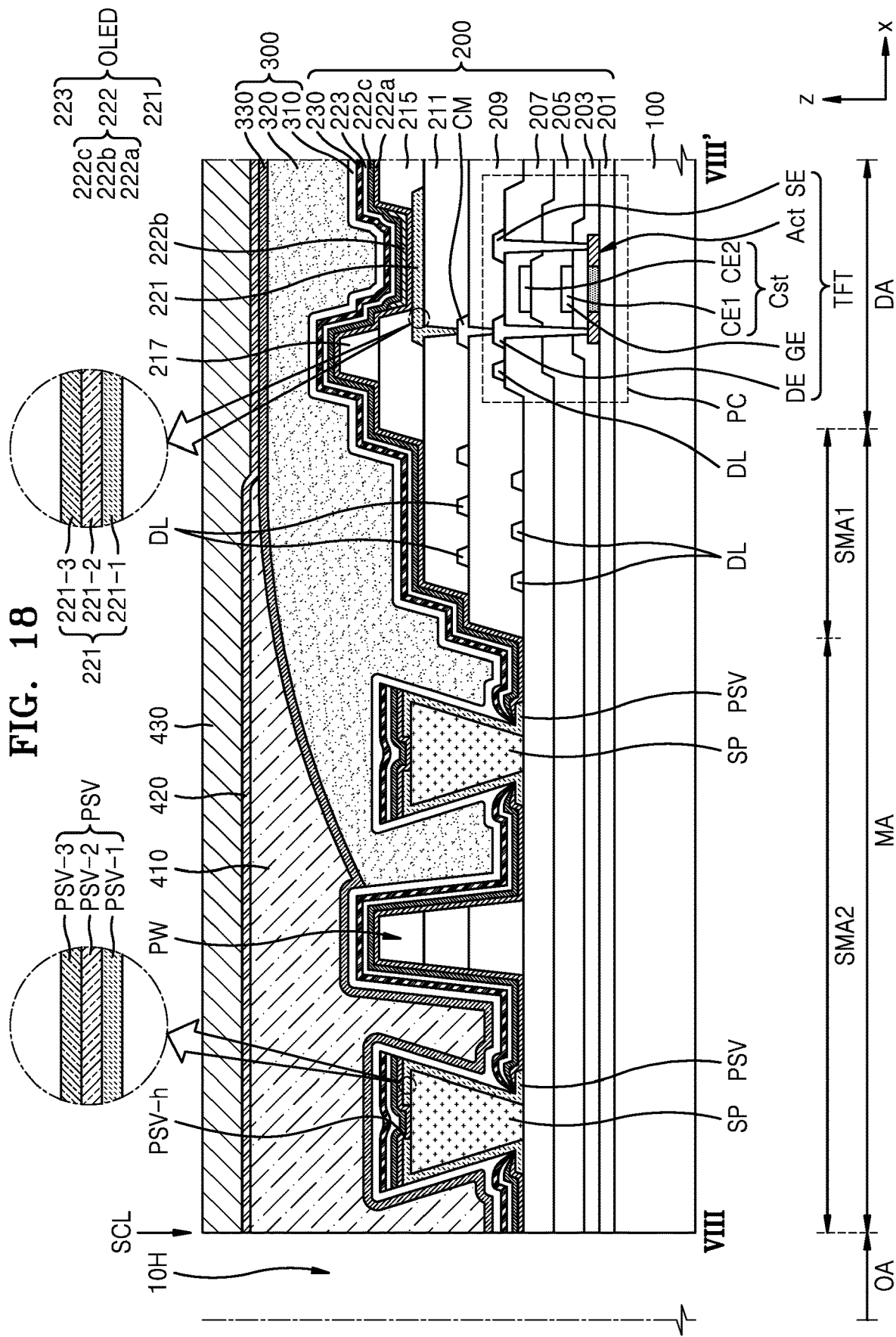
FIG. 18 is a cross-sectional view illustrating the display panel according to an exemplary embodiment of the present disclosure.

FIG. 18 is a cross-sectional view illustrating the display panel 10 according to an exemplary embodiment of the present disclosure.

Referring to FIG. 18, the inorganic layer PSV may include the same material as that of the pixel electrode 221. For example, as shown in an enlarged view of FIG. 18, the inorganic layer PSV may include a first sub-inorganic layer PSV-1, a second sub-inorganic layer PSV-2, and a third sub-inorganic layer PSV-3.

As described with reference to FIG. 8, the pixel electrode 221 may include a first sub-pixel electrode layer 221-1 and a third sub-pixel electrode layer 221-3 located under and over a second sub-pixel electrode layer 221-2 that is a reflective film. For example, the second sub-pixel electrode layer 221-2 may include Ag, and each of the first sub-pixel electrode layer 221-1 and the third sub-pixel electrode layer 221-3 may include a TCO such as ITO. The first sub-inorganic layer PSV-1, the second sub-inorganic layer PSV-2, and the third sub-inorganic layer PSV-3 of the inorganic layer PSV may respectively include the same materials as those of the first sub-pixel electrode layer 221-1, the second sub-pixel electrode layer 221-2, and the third sub-pixel electrode layer 221-3.

Although the separator SP is located on the second interlayer insulating layer 207 in FIG. 18, the present disclosure is not limited thereto. As described with reference to FIGS. 10 and 11, a metal layer or an organic layer may be located under the separator SP. The separator SP of FIG. 18 may have a shape of FIGS. 12A through 12C or a shape derived therefrom. The second interlayer insulating layer 207 of FIG. 18 may include a groove in which the separator SP is located as described with reference to FIG. 16.

Figure 19:
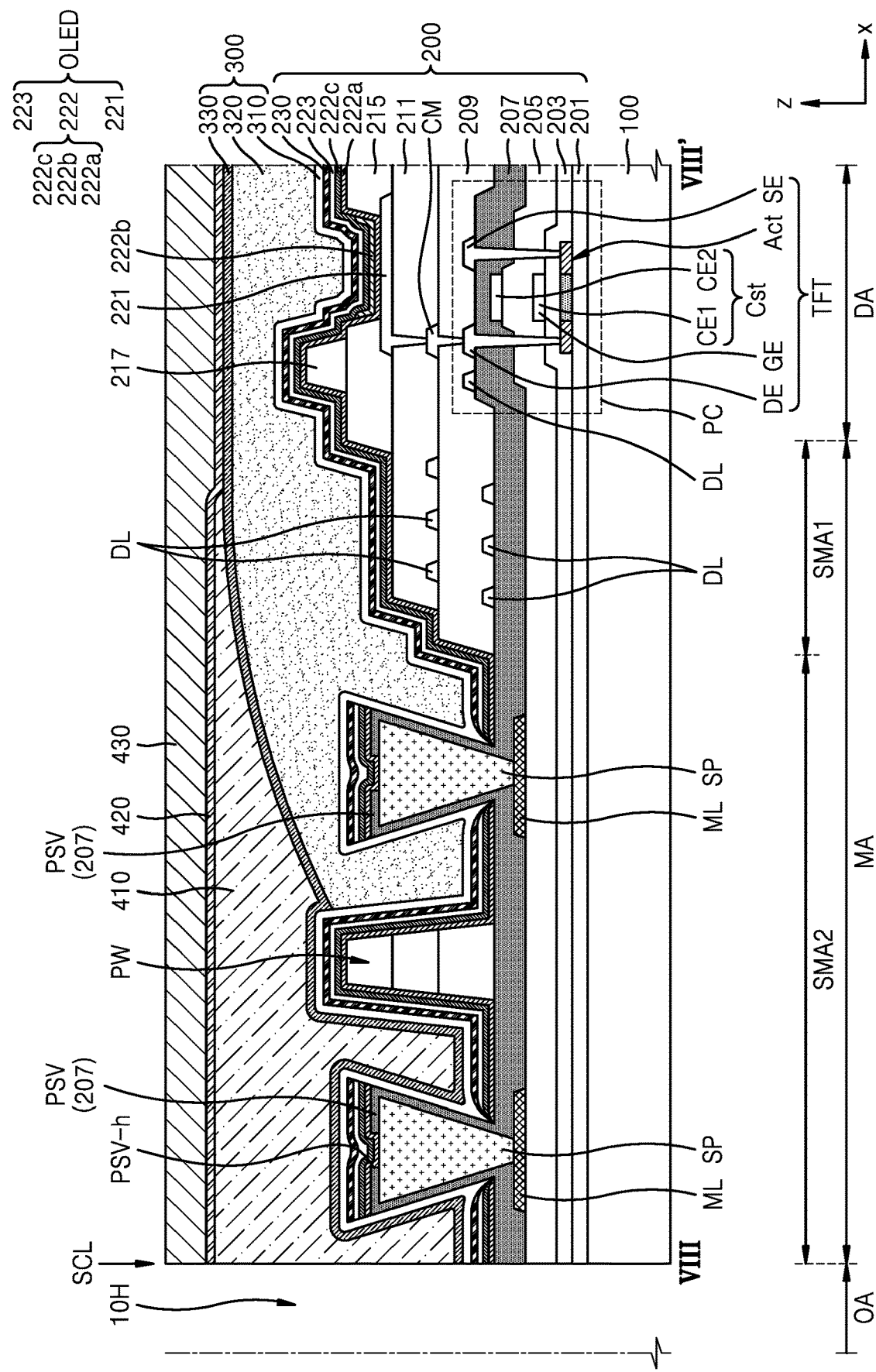
FIG. 19 is a cross-sectional view illustrating the display panel according to an exemplary embodiment of the present disclosure.

FIG. 19 is a cross-sectional view illustrating the display panel 10 according to an exemplary embodiment of the present disclosure.

Referring to FIG. 19, the separator SP may be located on the first interlayer insulating layer 205, and the inorganic layer PSV covering a part of a top surface and a side surface of the separator SP may include the second interlayer insulating layer 207. For example, the second interlayer insulating layer 207 may be the inorganic layer PSV. Alternatively, the inorganic layer PSV may include the second interlayer insulating layer 207. The inorganic layer PSV may include an insulating material, for example, an inorganic insulating material such as silicon oxide, silicon nitride, or silicon oxynitride. The inorganic layer PSV may have a multi-layer structure of the insulating material.

The inorganic layer PSV may be entirely formed on the substrate 100, and may cover a part of the top surface and the side surface of the separator SP. The inorganic layer PSV may have the hole PSV-h corresponding to the top surface of the separator SP.

The metal layer ML may be located under the separator SP, and a width and other characteristics of the metal layer ML are the same as those described with reference to FIG. 10. The metal layer ML may include the same material as an electrode including a metal from among a storage capacitor and a TFT of the pixel circuit PC. For example, the metal layer ML and the upper electrode CE2 of the storage capacitor Cst may include the same material and may be formed by using the same process.

Ends of the first functional layer 222a, the second functional layer 222c, the counter electrode 223, and/or the capping layer 230 might not contact the separator SP due to the inorganic layer PSV covering the separator SP as described above. The partition wall PW and the separator SP may be located on different layers.

Although the metal layer ML is located under the separator SP in FIG. 19, according to an exemplary embodiment of the present disclosure, the metal layer ML may be omitted. Alternatively, an organic layer, instead of the metal layer ML, may be located as described with reference to FIG. 11. The separator SP of FIG. 19 may have a shape of FIGS. 12A through 12C or a shape derived therefrom, and/or the first interlayer insulating layer 205 may include a groove having the same structure as that of a groove formed in the second interlayer insulating layer 207 of FIG. 16.

Figure 20:
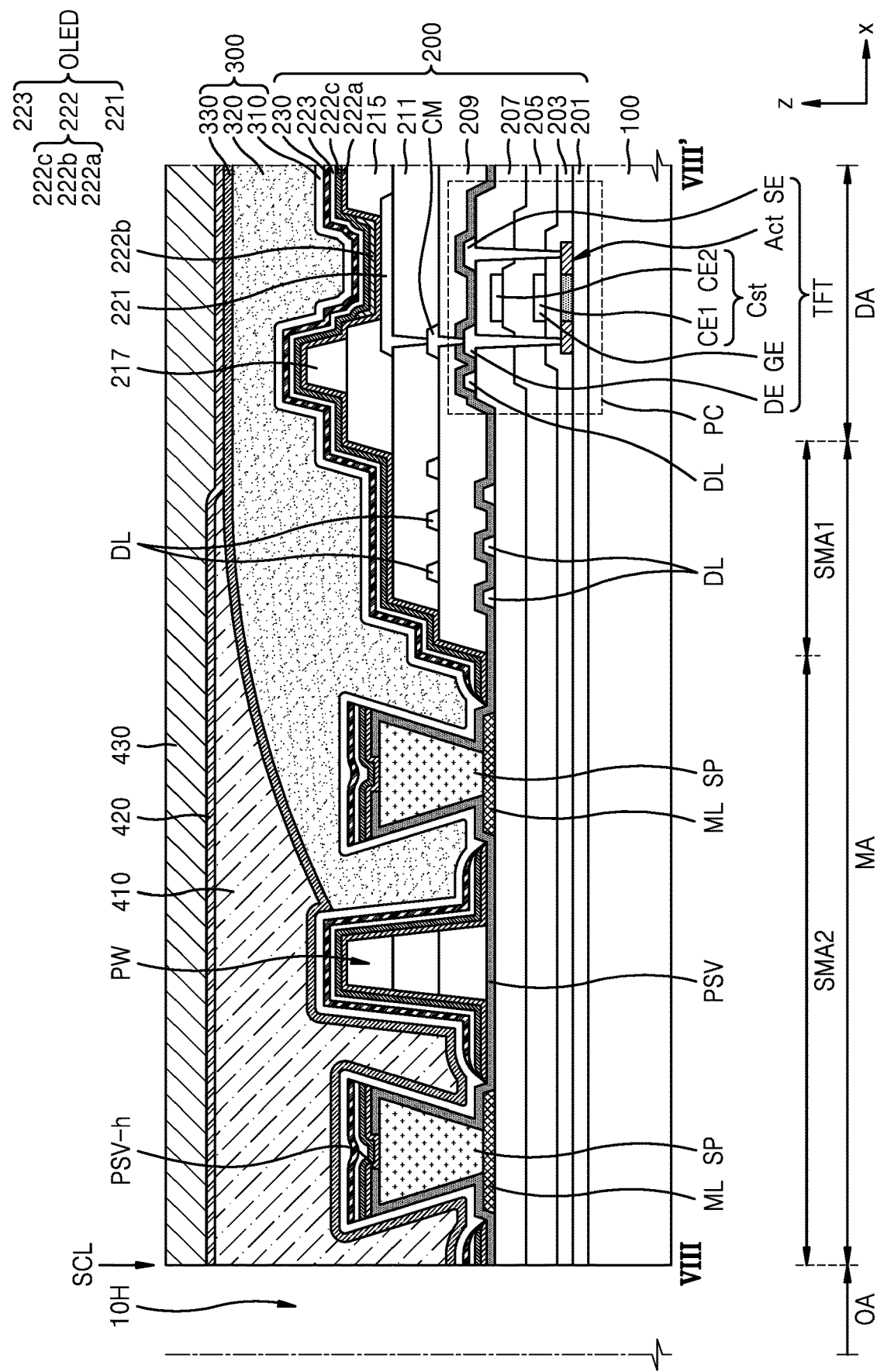
FIG. 20 is a cross-sectional view illustrating the display panel according to an exemplary embodiment of the present disclosure.

FIG. 20 is a cross-sectional view illustrating the display panel 10 according to an exemplary embodiment of the present disclosure.

Referring to FIG. 20, the separator SP may be located on the second interlayer insulating layer 207, and may be at least partially covered by the inorganic layer PSV having the hole PSV-h corresponding to a top surface of the separator SP. The inorganic layer PSV may cover a part of the top surface and a side surface of the separator SP, and may extend to the display area DA. For example, the inorganic layer PSV may be entirely formed on the substrate 100, and the inorganic layer PSV may cover the data lines DL located in the display area DA and the first intermediate area SMA1, and the source electrode SE and/or the drain electrode DE of the TFT. The inorganic layer PSV may contact the data lines DL in the display area DA and the first intermediate area SMA1. The inorganic layer PSV may include an inorganic insulating material.

The metal layer ML may be located under the separator SP, and a width and other characteristics of the metal layer ML may be the same as those described with reference to FIG. 10. The metal layer ML may include the same material as one of electrodes of a storage capacitor and a TFT of the pixel circuit PC. For example, the metal layer ML may include the same material as that of the data line DL, and the source electrode SE and/or the drain electrode DE of the TFT included in the pixel circuit PC.

Ends of the first functional layer 222a, the second functional layer 222c, the counter electrode 223, and/or the capping layer 230 might not contact the separator SP due to the inorganic layer PSV covering the separator SP as described above. The partition wall PW and the separator SP may be located on different layers. For example, the partition wall PW may be located on the inorganic layer PSV.

Although the metal layer ML is located under the separator SP in FIG. 20, according to an exemplary embodiment of the present disclosure, the metal layer ML may be omitted. Alternatively, an organic layer, instead of the metal layer ML, may be located as described with reference to FIG. 11. The separator SP of FIG. 20 may have a shape of FIGS. 12A through 12C or a shape derived therefrom, and/or the second interlayer insulating layer 207 of FIG. 20 may include a groove of FIG. 16.

Figure 21:
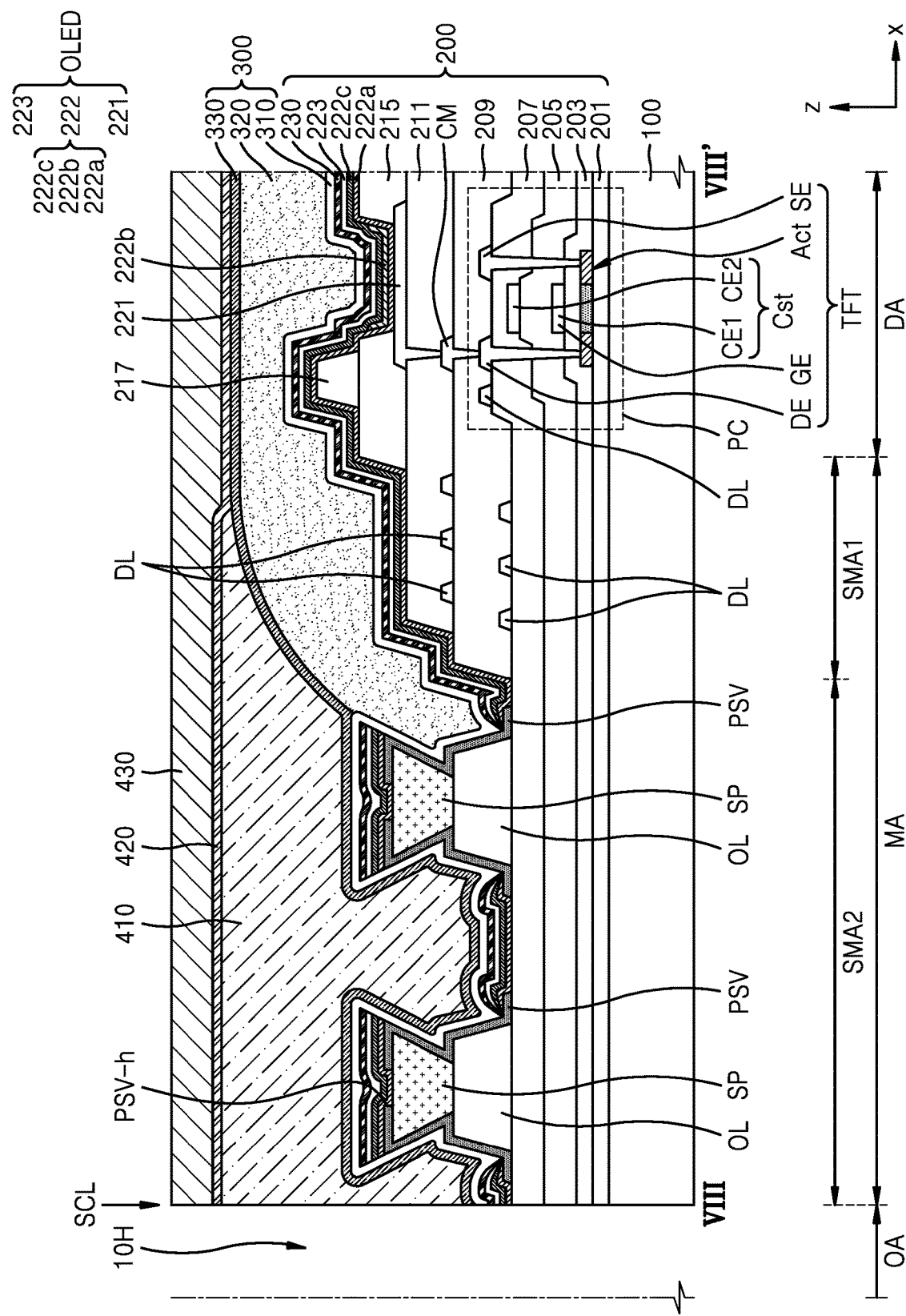
FIG. 21 is a cross-sectional view illustrating the display panel according to an exemplary embodiment of the present disclosure.

FIG. 21 is a cross-sectional view illustrating the display panel 10 according to an exemplary embodiment of the present disclosure.

Referring to FIG. 21, the organic layer OL may be located under the separator SP. The organic layer OL may include the same material as that of the first organic insulating layer 209. The organic layer OL and the first organic insulating layer 209 may be formed by using the same process.

The separator SP may be covered by the inorganic layer PSV having the hole PSV-h corresponding to a top surface of the separator SP. The inorganic layer PSV may include a conductive inorganic material such as a metal or an inorganic insulating material such as silicon nitride.

When the organic layer OL is located under the separator SP, the organic layer OL may have a thickness greater than that of an inorganic layer or a metal layer, and thus the separator SP may perform a function of the partition wall PW (see FIG. 8) of FIG. 8. Ends of the first functional layer 222a, the second functional layer 222c, the counter electrode 223, and/or the capping layer 230 might not contact the separator SP due to the inorganic layer PSV covering the separator SP as described above.

Although the organic layer OL is located under the separator SP in FIG. 21, according to an exemplary embodiment of the present disclosure, the organic layer OL may be omitted. Alternatively, a metal layer, instead of the organic layer OL, may be located as described with reference to FIG. 10. The separator SP of FIG. 21 may have a shape of FIGS. 12A through 12C or a shape derived therefrom.

A display panel, according to the one or more embodiments of the present disclosure, may prevent external impurities such as moisture around a first area from damaging a display area. However, such effects are examples, and thus effects according to exemplary embodiments of the present disclosure will be described below in detail.

In some instances, features, characteristics, and/or elements described in connection with a particular embodiment may be used singly or in combination with features, characteristics, and/or elements described in connection with other embodiments unless otherwise specifically indicated.

While one or more embodiments have been described herein with reference to the figures, it will be understood by those of ordinary skill in the art that various changes in form and details may be made therein without departing from the spirit and scope of the present disclosure.

What is claimed is:

1. A display panel, comprising:
   a substrate comprising a first area, a second area, and a third area between the first area and the second area;
   a plurality of display elements disposed in the second area, the plurality of display elements comprising two display elements spaced apart from each other with the first area disposed therebetween, wherein each of the plurality of display elements comprises a pixel electrode, a portion of a counter electrode, and a portion of an intermediate layer disposed between the pixel electrode and the portion of the counter electrode;
   a separator disposed in the third area and comprising at least one reverse-tapered inclined surface; and
   an inorganic layer disposed on the separator and including at least one hole, wherein the at least one hole is over a top surface of the separator and has a width that is less than a width of the top surface of the separator,
   wherein at least one sub-layer included in the intermediate layer is disposed over the separator and a portion of the at least one sub-layer that is disposed over the separator is discontinuous with portions of the at least one sub-layer that are disposed on opposite sides of the separator.

2. The display panel of claim 1, wherein the at least one sub-layer comprises an organic material.

3. The display panel of claim 1, wherein an inorganic material covers at least a part of a top surface of the separator and a side surface of the separator.

4. The display panel of claim 1, wherein the at least one sub-layer is disposed over the inorganic layer, and the separator is disposed under the inorganic layer.

5. The display panel of claim 1, wherein the separator comprises a photosensitive material.

6. The display panel of claim 1, wherein the at least one sub-layer comprises a hole transport layer, a hole injection layer, an electron transport layer, and/or an electron injection layer.

7. The display panel of claim 1, wherein the portion of the intermediate layer disposed between the pixel electrode and the portion of the counter electrode is a first portion of the intermediate layer and a second portion of the intermediate layer is within the at least one hole.

8. The display panel of claim 1, further comprising a metal layer disposed in the third area, wherein the separator is disposed on the metal layer.

9. The display panel of claim 8, wherein a width of the metal layer is greater than or equal to a width of a top surface of the separator.

10. The display panel of claim 8, wherein the inorganic layer at least partially covers the metal layer and extends to an upper surface of an insulating layer disposed under the metal layer.

11. The display panel of claim 1, further comprising an organic layer disposed in the third area, wherein the separator is disposed on the organic layer.

12. The display panel of claim 11, wherein the inorganic layer at least partially covers the organic layer and extends to an upper surface of an insulating layer disposed under the organic layer.

13. The display panel of claim 1, wherein an inclination angle between the at least one reverse-tapered inclined surface and a top surface of the substrate is less than or equal to 30°.

14. The display panel of claim 1, further comprising at least one insulating layer disposed between the substrate and the separator, wherein the at least one insulating layer comprises a groove corresponding to the separator.

15. The display panel of claim 1, wherein the display panel comprises an opening corresponding to the first area.

16. A display panel, comprising:
   a substrate comprising a first area, a second area, and a third area disposed between the first area and the second area;

a plurality of display elements disposed in the second area, the plurality of display elements comprising two display elements spaced apart from each other to define the first area;

a separator disposed in the third area and extending along an edge of the first area;

an inorganic layer disposed on the separator and including at least one hole, wherein the at least one hole is over a top surface of the separator and has a width that is less than a width of the to surface of the separator; and at least one insulating layer disposed between the substrate and the separator, wherein the separator has a plurality of inclined surfaces, wherein at least one inclined surface of the plurality of inclined surfaces is reverse-tapered, and wherein a sub-layer comprising an organic material is disposed within the plurality of display elements, wherein the sub-layer comprising the organic material is disposed over the separator and is discontinuous with portions of the sub-layer disposed on opposite sides of the separator.

17. The display panel of claim 16, wherein an inclination angle of the at least one reverse-tapered inclined surface, with respect to a top surface of the substrate, is less than or equal to 30°.

18. The display panel of claim 16, wherein inclination angles of the plurality of reverse-tapered inclined surfaces are different from one another.

19. The display panel of claim 16, wherein the separator comprises a photosensitive resin.

20. The display panel of claim 16, wherein the at least one insulating layer comprises an inorganic insulating layer.

21. The display panel of claim 16, wherein the at least one insulating layer comprises a groove, and the separator is disposed within the groove.

22. The display panel of claim 16, further comprising a metal layer disposed between the at least one insulating layer and the separator, wherein the separator directly contacts the metal layer.

23. The display panel of claim 22, wherein a width of the metal layer is greater than or equal to a width of a top surface of the separator.

24. The display panel of claim 16, further comprising an organic layer disposed between the at least one insulating layer and the separator, wherein the separator directly contacts the organic layer.

25. The display panel of claim 24, wherein a width of a top surface of the organic layer is greater than or equal to a width of a bottom surface of the separator.

26. The display panel of claim 16, wherein the inorganic layer covers a side surface of the separator and extends to the at least one insulating layer.

27. The display panel of claim 26, wherein the inorganic layer directly contacts the at least one insulating layer.

28. The display panel of claim 26, wherein the portion of the intermediate layer disposed between the pixel electrode and the portion of the counter electrode is a first portion of the intermediate layer and a second a portion of the intermediate layer is within the at least one hole.

29. The display panel of claim 26, wherein the inorganic layer comprises a metal or an inorganic insulating material.

30. The display panel of claim 26, wherein the inorganic layer extends to the second area.

* * * * *